United States Patent
Tasic et al.

(10) Patent No.: US 9,154,357 B2
(45) Date of Patent: Oct. 6, 2015

(54) MULTIPLE-INPUT MULTIPLE-OUTPUT (MIMO) LOW NOISE AMPLIFIERS FOR CARRIER AGGREGATION

(75) Inventors: Aleksandar Miodrag Tasic, San Diego, CA (US); Anosh Bomi Davierwalla, San Diego, CA (US); Berke Cetinoneri, Encinitas, CA (US); Jusung Kim, San Diego, CA (US); Chiewcharn Narathong, Laguna Niguel, CA (US); Klaas van Zalinge, La Jolla, CA (US); Gurkanwal Singh Sahota, San Diego, CA (US); James Ian Jaffee, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/593,764

(22) Filed: Aug. 24, 2012

(65) Prior Publication Data
US 2013/0316670 A1    Nov. 28, 2013

Related U.S. Application Data

(60) Provisional application No. 61/652,064, filed on May 25, 2012.

(51) Int. Cl.
*H04B 1/18* (2006.01)
*H04L 27/26* (2006.01)
(Continued)

(52) U.S. Cl.
CPC ............ *H04L 27/2647* (2013.01); *H03F 1/223* (2013.01); *H03F 3/193* (2013.01); *H03F 3/68* (2013.01); *H03F 3/72* (2013.01); *H03G 3/20* (2013.01)

(58) Field of Classification Search
CPC ............ H03F 1/223; H03F 1/30; H03F 1/52; H03F 1/56; H03F 3/191; H03F 3/72; H03F 1/26; H03F 2200/111; H03F 2200/222; H03F 2200/372; H03F 2200/429; H03F 2200/447; H03F 2200/456; H03F 2200/489; H03F 2200/492; H03F 2203/7206; H03F 2203/7209; H03G 3/3052; H03G 1/0088; H03G 3/3036
USPC ........... 455/293, 168.1, 194.2, 334, 341, 340, 455/130, 132, 139–140, 225, 242.1, 292, 455/303, 326, 332–333, 338; 330/51, 283, 330/295, 296, 289; 327/355, 356–361
See application file for complete search history.

(56) References Cited

U.S. PATENT DOCUMENTS

| 3,911,364 A | 10/1975 | Langseth et al. |
| 4,035,728 A | 7/1977 | Ishikawa et al. |

(Continued)

FOREIGN PATENT DOCUMENTS

| CN | 1523912 A | 8/2004 |
| CN | 1922795 A | 2/2007 |

(Continued)

OTHER PUBLICATIONS

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

(Continued)

*Primary Examiner* — Pablo Tran
(74) *Attorney, Agent, or Firm* — Ramin Mobarhan

(57) ABSTRACT

Multiple-input multiple-output (MIMO) low noise amplifiers (LNAs) supporting carrier aggregation are disclosed. In an exemplary design, an apparatus (e.g., a wireless device, an integrated circuit, etc.) includes a MIMO LNA having a plurality of gain circuits, a drive circuit, and a plurality of load circuits. The gain circuits receive at least one input radio frequency (RF) signal and provide at least one amplified RF signal. Each gain circuit receives and amplifies one input RF signal and provides one amplified RF signal when the gain circuit is enabled. The at least one input RF signal include transmissions sent on multiple carriers at different frequencies to the wireless device. The drive circuit receives the at least one amplified RF signal and provides at least one drive RF signal. The load circuits receive the at least one drive RF signal and provide at least one output RF signal.

20 Claims, 14 Drawing Sheets

(51) Int. Cl.
  *H03G 3/20* (2006.01)
  *H03F 1/22* (2006.01)
  *H03F 3/193* (2006.01)
  *H03F 3/68* (2006.01)
  *H03F 3/72* (2006.01)

(56) References Cited

U.S. PATENT DOCUMENTS

| | | |
|---|---|---|
| 4,035,729 A | 7/1977 | Perry |
| 4,246,655 A | 1/1981 | Parker |
| 4,326,294 A | 4/1982 | Okamoto et al. |
| 4,715,048 A | 12/1987 | Masamura |
| 4,742,563 A | 5/1988 | Fukumura |
| 4,756,023 A | 7/1988 | Kojima |
| 4,969,207 A | 11/1990 | Sakamoto et al. |
| 5,056,411 A | 10/1991 | Baker |
| 5,128,630 A | 7/1992 | Mijuskovic |
| 5,291,519 A | 3/1994 | Tsurumaru |
| 5,321,850 A | 6/1994 | Backstrom et al. |
| 5,345,601 A | 9/1994 | Takagi et al. |
| 5,390,342 A | 2/1995 | Takayama et al. |
| 5,559,838 A | 9/1996 | Nakagoshi |
| 5,566,364 A | 10/1996 | Mizoguchi et al. |
| 5,694,396 A | 12/1997 | Firouzbakht et al. |
| 5,697,083 A | 12/1997 | Sano |
| 5,761,613 A | 6/1998 | Saunders et al. |
| 5,794,159 A | 8/1998 | Portin |
| 5,805,643 A | 9/1998 | Seki et al. |
| 5,805,989 A | 9/1998 | Ushida |
| 5,835,853 A | 11/1998 | Enoki et al. |
| 5,940,452 A | 8/1999 | Rich |
| 5,999,815 A | 12/1999 | Tenbrook et al. |
| 5,999,990 A | 12/1999 | Sharrit et al. |
| 6,026,288 A | 2/2000 | Bronner |
| 6,040,732 A | 3/2000 | Brokaw |
| 6,044,254 A | 3/2000 | Ohta et al. |
| 6,063,961 A | 5/2000 | Kroner |
| 6,069,923 A | 5/2000 | Ostman et al. |
| 6,088,348 A | 7/2000 | Bell, III |
| 6,208,844 B1 | 3/2001 | Abdelgany |
| 6,249,687 B1 | 6/2001 | Thomsen et al. |
| 6,407,689 B1 | 6/2002 | Bazarjani et al. |
| 6,424,683 B1 | 7/2002 | Schollhorn |
| 6,430,237 B1 | 8/2002 | Anvari |
| 6,472,947 B1 | 10/2002 | Zeitz |
| 6,473,601 B1 | 10/2002 | Oda |
| 6,522,895 B1 | 2/2003 | Montalvo |
| 6,535,725 B2 | 3/2003 | Hatcher et al. |
| 6,600,759 B1 | 7/2003 | Wood |
| 6,600,907 B1 | 7/2003 | Taguchi |
| 6,600,931 B2 | 7/2003 | Sutton et al. |
| 6,657,498 B2* | 12/2003 | Park et al. ................. 330/285 |
| 6,806,777 B2* | 10/2004 | Franca-Neto ................. 330/311 |
| 6,819,941 B2 | 11/2004 | Dening et al. |
| 6,888,888 B1 | 5/2005 | Tu et al. |
| 6,952,594 B2 | 10/2005 | Hendin |
| 6,954,446 B2 | 10/2005 | Kuffner |
| 6,983,132 B2 | 1/2006 | Woo et al. |
| 6,985,712 B2 | 1/2006 | Yamakawa et al. |
| 6,987,950 B2 | 1/2006 | Coan |
| 7,013,166 B2 | 3/2006 | Clifford |
| 7,024,172 B1 | 4/2006 | Murphy et al. |
| 7,039,377 B2 | 5/2006 | Yates |
| 7,123,891 B2 | 10/2006 | Loke |
| 7,142,042 B1 | 11/2006 | Henry |
| 7,161,423 B2 | 1/2007 | Paul et al. |
| 7,167,044 B2 | 1/2007 | Li et al. |
| 7,187,239 B2 | 3/2007 | Yeh |
| 7,187,735 B2 | 3/2007 | Kent, III |
| 7,187,904 B2 | 3/2007 | Gainey et al. |
| 7,212,788 B2 | 5/2007 | Weber et al. |
| 7,224,231 B2 | 5/2007 | Wu |
| 7,260,377 B2 | 8/2007 | Burns et al. |
| 7,283,851 B2 | 10/2007 | Persico et al. |
| 7,299,021 B2 | 11/2007 | Parssinen et al. |
| 7,313,368 B2 | 12/2007 | Wu et al. |
| 7,317,894 B2 | 1/2008 | Hirose |
| 7,333,831 B2 | 2/2008 | Srinivasan et al. |
| 7,356,325 B2 | 4/2008 | Behzad et al. |
| 7,372,336 B2* | 5/2008 | Lee et al. ................. 330/307 |
| 7,403,508 B1 | 7/2008 | Miao |
| 7,444,166 B2 | 10/2008 | Sahota et al. |
| 7,454,181 B2 | 11/2008 | Banister et al. |
| 7,477,106 B2 | 1/2009 | Van Bezooijen et al. |
| 7,486,135 B2* | 2/2009 | Mu ................. 330/51 |
| 7,570,111 B1 | 8/2009 | Vagher et al. |
| 7,599,675 B2 | 10/2009 | Mu et al. |
| 7,643,847 B2 | 1/2010 | Daanen et al. |
| 7,643,848 B2 | 1/2010 | Robinett et al. |
| 7,697,905 B2 | 4/2010 | Lee et al. |
| 7,728,664 B2 | 6/2010 | Chang et al. |
| 7,751,513 B2 | 7/2010 | Eisenhut et al. |
| 7,764,726 B2 | 7/2010 | Simic et al. |
| 7,848,724 B2 | 12/2010 | Bult et al. |
| 7,869,528 B2 | 1/2011 | Robinson |
| 7,877,075 B1 | 1/2011 | Jin et al. |
| 7,911,269 B2 | 3/2011 | Yang et al. |
| 7,944,298 B2 | 5/2011 | Cabanillas et al. |
| 7,949,309 B2 | 5/2011 | Rofougaran et al. |
| 7,952,398 B2 | 5/2011 | Salcido et al. |
| 8,022,772 B2* | 9/2011 | Cassia et al. ................. 330/311 |
| 8,055,229 B2* | 11/2011 | Huang ................. 455/232.1 |
| 8,063,706 B2 | 11/2011 | Li et al. |
| 8,081,672 B2 | 12/2011 | Kent et al. |
| 8,090,332 B2 | 1/2012 | Sahota et al. |
| 8,090,369 B2 | 1/2012 | Kitazoe |
| 8,139,670 B1 | 3/2012 | Son et al. |
| 8,149,955 B2 | 4/2012 | Tired |
| 8,195,117 B2 | 6/2012 | Bult et al. |
| 8,208,887 B2 | 6/2012 | Lee et al. |
| 8,217,723 B2 | 7/2012 | Rajendran et al. |
| 8,242,841 B2 | 8/2012 | Zhang |
| 8,270,927 B2 | 9/2012 | Wallace et al. |
| 8,290,449 B2 | 10/2012 | Keehr et al. |
| 8,295,778 B2 | 10/2012 | Kotecha et al. |
| 8,306,494 B2 | 11/2012 | Ojo |
| 8,442,473 B1 | 5/2013 | Kaukovuori et al. |
| 8,514,015 B2 | 8/2013 | Chen |
| 8,571,510 B2* | 10/2013 | Liu et al. ................. 455/313 |
| 8,600,315 B2 | 12/2013 | Roufoogaran et al. |
| 8,626,084 B2 | 1/2014 | Chan et al. |
| 8,676,148 B2 | 3/2014 | Ogasawara |
| 8,706,069 B2 | 4/2014 | Khoini-Poorfard et al. |
| 2002/0008575 A1 | 1/2002 | Oskowsky et al. |
| 2002/0061773 A1 | 5/2002 | Adachi et al. |
| 2002/0111163 A1 | 8/2002 | Hamabe |
| 2002/0132597 A1 | 9/2002 | Peterzell et al. |
| 2002/0173337 A1 | 11/2002 | Hajimiri et al. |
| 2002/0193108 A1 | 12/2002 | Robinett |
| 2003/0076797 A1 | 4/2003 | Lozano |
| 2003/0081694 A1 | 5/2003 | Wieck |
| 2003/0125040 A1 | 7/2003 | Walton et al. |
| 2003/0148750 A1 | 8/2003 | Yan et al. |
| 2003/0157915 A1 | 8/2003 | Atkinson et al. |
| 2003/0176176 A1 | 9/2003 | Leinonen et al. |
| 2003/0203743 A1 | 10/2003 | Sugar et al. |
| 2003/0206076 A1 | 11/2003 | Hashemi et al. |
| 2003/0228851 A1 | 12/2003 | Taniguchi |
| 2004/0087290 A1 | 5/2004 | Schmidt et al. |
| 2004/0092243 A1 | 5/2004 | Hey-Shipton |
| 2004/0113746 A1 | 6/2004 | Brindle |
| 2004/0116086 A1 | 6/2004 | Huttunen |
| 2004/0121753 A1 | 6/2004 | Sugar et al. |
| 2004/0204104 A1 | 10/2004 | Horng et al. |
| 2004/0219959 A1 | 11/2004 | Khayrallah et al. |
| 2004/0224643 A1 | 11/2004 | Nakai |
| 2004/0253955 A1 | 12/2004 | Love et al. |
| 2004/0266356 A1 | 12/2004 | Javor et al. |
| 2005/0039060 A1 | 2/2005 | Okayasu |
| 2005/0075077 A1 | 4/2005 | Mach et al. |
| 2005/0079847 A1 | 4/2005 | Arafa |
| 2005/0118977 A1 | 6/2005 | Drogi et al. |
| 2005/0197090 A1 | 9/2005 | Stockstad et al. |
| 2005/0215264 A1 | 9/2005 | Subramaniam et al. |

(56) References Cited

U.S. PATENT DOCUMENTS

| | | |
|---|---|---|
| 2005/0231290 A1* | 10/2005 | Hung et al. ............... 330/311 |
| 2005/0265084 A1 | 12/2005 | Choi |
| 2005/0277387 A1 | 12/2005 | Kojima et al. |
| 2006/0009177 A1 | 1/2006 | Persico et al. |
| 2006/0023745 A1 | 2/2006 | Koo et al. |
| 2006/0061773 A1 | 3/2006 | Lee et al. |
| 2006/0121937 A1 | 6/2006 | Son |
| 2006/0128322 A1 | 6/2006 | Igarashi et al. |
| 2006/0146693 A1 | 7/2006 | Mori et al. |
| 2006/0170503 A1 | 8/2006 | Lee et al. |
| 2006/0189286 A1* | 8/2006 | Kyu et al. ............... 455/144 |
| 2006/0222100 A1 | 10/2006 | Behzad |
| 2006/0234662 A1 | 10/2006 | Diloisy |
| 2006/0291428 A1 | 12/2006 | Filipovic |
| 2007/0049332 A1 | 3/2007 | Higuchi |
| 2007/0060080 A1 | 3/2007 | Nishimura et al. |
| 2007/0072577 A1 | 3/2007 | Rozenblit et al. |
| 2007/0105517 A1 | 5/2007 | Chang et al. |
| 2007/0142013 A1 | 6/2007 | Bucknor et al. |
| 2007/0177656 A1 | 8/2007 | Maruta et al. |
| 2007/0177693 A1 | 8/2007 | Kluge |
| 2007/0184801 A1 | 8/2007 | Kogawa et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0004078 A1 | 1/2008 | Barratt et al. |
| 2008/0013654 A1 | 1/2008 | Rick et al. |
| 2008/0117999 A1 | 5/2008 | Kadous et al. |
| 2008/0139151 A1 | 6/2008 | Ojo et al. |
| 2008/0204148 A1 | 8/2008 | Kim et al. |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2008/0297259 A1 | 12/2008 | Mu |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0041359 A1 | 2/2010 | Liu et al. |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1 | 10/2010 | Ichitsubo et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1 | 8/2011 | Hu et al. |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0043946 A1 | 2/2013 | Hadjichristos et al. |
| 2013/0051284 A1 | 2/2013 | Khlat |
| 2013/0114769 A1 | 5/2013 | Fernando |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0315348 A1 | 11/2013 | Tasic et al. |
| 2013/0316668 A1 | 11/2013 | Davierwalla et al. |
| 2013/0316669 A1 | 11/2013 | Davierwalla et al. |
| 2013/0329665 A1 | 12/2013 | Kadous et al. |
| 2014/0072001 A1 | 3/2014 | Chang et al. |
| 2014/0113578 A1 | 4/2014 | Xu et al. |
| 2014/0269853 A1 | 9/2014 | Gudem et al. |

FOREIGN PATENT DOCUMENTS

| | | |
|---|---|---|
| CN | 101228702 A | 7/2008 |
| CN | 101242158 A | 8/2008 |
| CN | 101523967 A | 9/2009 |
| CN | 101789805 A | 7/2010 |
| EP | 1164719 A1 | 12/2001 |
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | H11127300 A | 5/1999 |
| JP | 2000013278 A | 1/2000 |
| JP | 2001285114 A | 10/2001 |
| JP | 2002261880 A | 9/2002 |
| JP | 2004015162 A | 1/2004 |
| JP | 2006520143 A | 8/2006 |
| JP | 2007324711 A | 12/2007 |
| JP | 2008085793 A | 4/2008 |

(56) References Cited

FOREIGN PATENT DOCUMENTS

| | | | |
|---|---|---|---|
| JP | 2008519535 A | 6/2008 | |
| JP | 2009130867 A | 6/2009 | |
| JP | 2011015112 A | 1/2011 | |
| JP | 2011082669 A | 4/2011 | |
| JP | 2011091747 A | 5/2011 | |
| JP | 2011119807 A | 6/2011 | |
| WO | 0150636 | 7/2001 | |
| WO | 0237686 | 5/2002 | |
| WO | 2005039060 | 4/2005 | |
| WO | 2005062477 A2 | 7/2005 | |
| WO | 2005088847 A1 | 9/2005 | |
| WO | 2006050515 A2 | 5/2006 | |
| WO | 2006118538 A2 | 11/2006 | |
| WO | 2008059257 A1 | 5/2008 | |
| WO | 2008084539 A1 | 7/2008 | |
| WO | 2008092745 A1 | 8/2008 | |
| WO | 2008103757 | 8/2008 | |
| WO | 2008145604 A1 | 12/2008 | |
| WO | 2010059257 A1 | 5/2010 | |
| WO | 2011019850 A1 | 2/2011 | |
| WO | 2011050729 A1 | 5/2011 | |
| WO | 2011092005 A1 | 8/2011 | |
| WO | 2011138697 A1 | 11/2011 | |
| WO | 2012008705 A2 | 1/2012 | |
| WO | 2012049529 A1 | 4/2012 | |
| WO | 2013036794 A1 | 3/2013 | |
| WO | 2013131047 | 9/2013 | |

OTHER PUBLICATIONS

Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Broyde F., et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.

Chen, et al, "A 5-6 GHz 1-V CMOS Direct-Conversion Receiver With an Integrated Quadrature Coupler," IEEE Journal of Solid-State Circuits, vol. 42, No. 9, 2007, pp. 1963-1975.

Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, 2006, pp. 197-199.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Hashemi, et al., "Concurrent Multiband Low-Noise Amplifiers—Theory, Design, and Applications," IEEE Transactions on Microwave Theory and Techniques, vol. 50, No. 1, Jan. 2002.

Henrik M et al., "A Full Duplex Front End Module for WiFi 802.11.n. Applications", European Microwave Association, vol. 12, No. 4, Oct. 2008, pp. 162-165.

Hwang, et al., "A High IIP2 Direct-Conversion Receiver using Even-Harmonic Reduction Technique for Cellular CDMA/PCS/GPS applications," IEEE Transaction on Circuits and Systems.

Jones W. W., et al., "Narrowband interference suppression using filter-bank analysis/synthesis techniques", Military Communications Conference, 1992. Milcom '92, Conference Rec0r D. Communications—Fusing Command, Control and Intelligence., IEEE San Diego, CA, USA, 14 Oct. 11, 1992, New York, NY, USA, IEEE, US, Oct. 11, 1992, pp. 898-902, XP010060840, DOI: 10.1109/MILCOM.1992.243977, ISBN: 978-0/7803-0585-4.

Jussi R et al., "A Dual-Band RF Front-End for WCDMA and GSM Applications", IEEE, Journal Solid-State Circuits, 2001, vol. 36, No. 8, pp. 1198-1204.

Kevin W et al., "3G/4G Multimode Cellular Front End Challenges", Part 2: Architecture Discussion, RFMD® White Paper, 9 pages.

Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.

Lai, C.M.,et al., "Compact router transceiver architecture for carrier aggregation systems", Microwave Conference (EUMC), 2011 41st European, IEEE, Oct. 10, 2011, pp. 693-696, XP032072825, ISBN: 978-1-61284-235-6 the whole document.

Lee et al., "Development of Miniature Quad SAW filter bank based on PCB substrate", IEEE Intl Frequency Control Symp, pp. 146-149, 2007.

MSM6000 Chipset Solution, Qualcomm Incorporated.
MSM6500 Chipset Solution, Qualcomm Incorporated.

Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.

Qualcomm Europe: "UE Implementation Impact due to 4C-HSDPA Operation", 3GPP Draft; R1-094067_UE_IMPL_IMPACT_4C_HSDPA, 3rd Generation Partnership Project (3GPP), Mobile Competence Centre ; 650, Route Des Lucioles ; F-06921 Sophia-Antipolis Cedex ; France, no. Miyazaki; Oct. 12, 2009, XP050388547, [retrieved on Oct. 6, 2009].

Rahn D.G., et al., "A fully integrated multiband MIMO WLAN transceiver RFIC," IEEE J. Solid-State Circuits, 2005, vol. 40 (8), 1629-1641.

Sever et al. "A Dual-Antenna Phase-Array Ultra-Wideband CMOS Transceiver". IEEE Communications Magazine [Online] 2006, vol. 44, Issue 8, pp. 102-110. See pp. 104-107.

Tasic A. et al., "Design of Adaptive Multimode RF Front-End Circuits", IEEE Journal of Solid-State Circuits, vol. 42, Issue 2, Feb. 2007 pp. 313-322.

"UMTS Picocell Front End Module", CTS Corp. 8 pages.

Winternitz, et al., "A GPS Receiver for High-Altitude Satellite Navigation," IEEE Journal of Selected Topics in Signal Processing, vol. 3, No. 4, pp. 541-556, Aug. 2009.

International Search Report and Written Opinion—PCT/US2013/042761—ISA/EPO—Sep. 20, 2013.

Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. Ran WG1, no. Dresden, Germany; Jun. 22, 2010, XP050449298, [retrieved on Jun. 22, 2010] the whole document.

* cited by examiner

MULTIPLE-INPUT MULTIPLE-OUTPUT (MIMO) LOW NOISE AMPLIFIERS FOR CARRIER AGGREGATION

CLAIM OF PRIORITY UNDER 35 U.S.C. §119

The present application for patent claims priority to Provisional U.S. Application Ser. No. 61/652,064, entitled "LOW NOISE AMPLIFIERS FOR CARRIER AGGREGATION," filed May 25, 2012, assigned to the assignee hereof, and expressly incorporated herein by reference.

BACKGROUND

I. Field

The present disclosure relates generally to electronics, and more specifically to low noise amplifiers (LNAs).

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

MIMO LNAs having multiple inputs and multiple outputs and supporting carrier aggregation are disclosed herein. These MIMO LNAs may be used for various types of electronic devices such as wireless communication devices.

Figure 1:
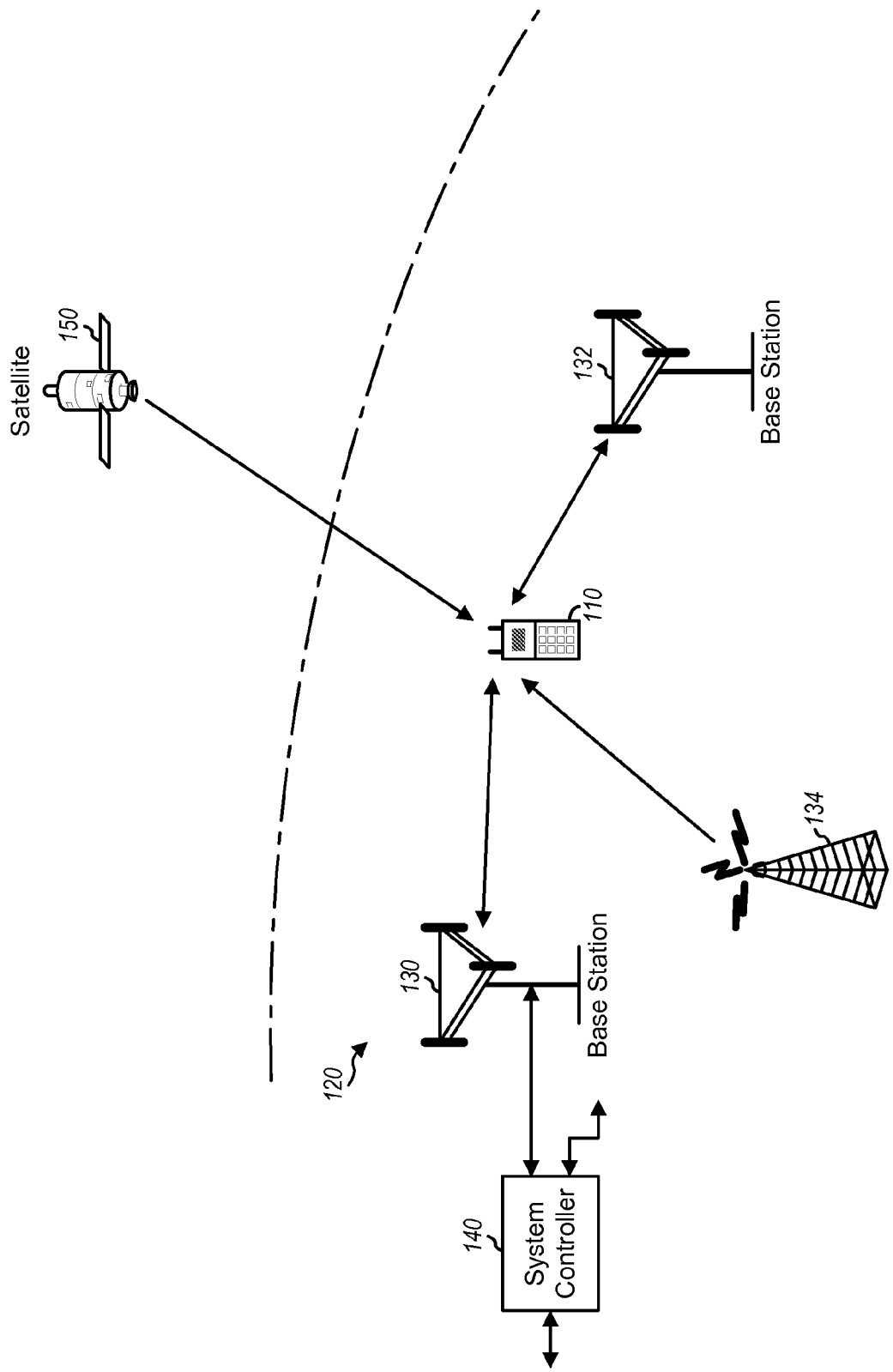
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), cdma2000, or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, cdma2000, WCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band from 698 to 960 megahertz (MHz), mid-band from 1475 to 2170 MHz, and/or high-band from 2300 to 2690 and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
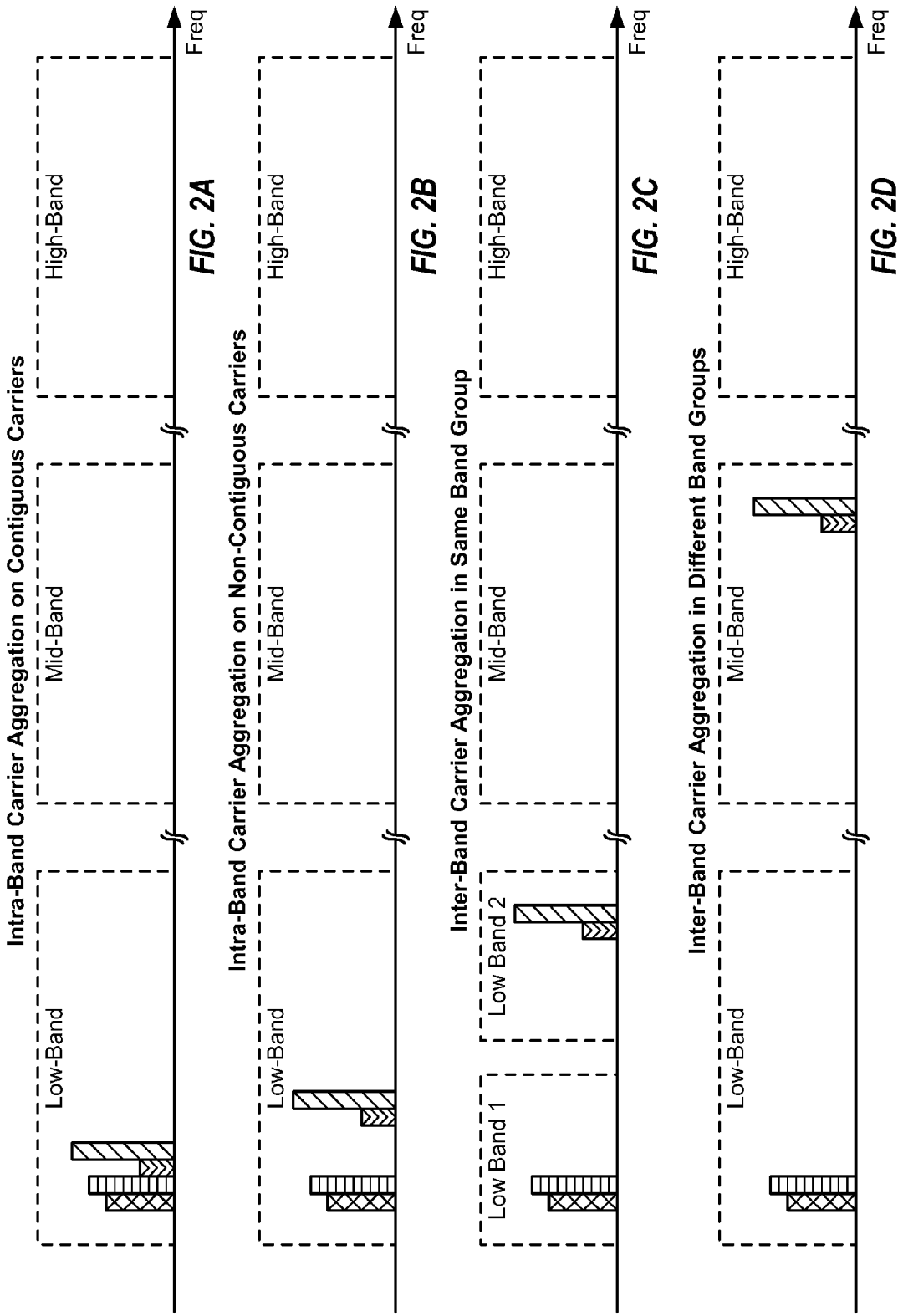
FIGS. 2A to 2D show four examples of carrier aggregation (CA).

FIG. 2A shows an example of contiguous intra-band CA. In the example shown in FIG. 2A, wireless device 110 is configured with four contiguous carriers in the same band, which is a band in low-band. Wireless device 110 may receive transmissions on multiple contiguous carriers within the same band.

FIG. 2B shows an example of non-contiguous intra-band CA. In the example shown in FIG. 2B, wireless device 110 is configured with four non-contiguous carriers in the same band, which is a band in low-band. The carriers may be separated by 5 MHz, 10 MHz, or some other amount. Wireless device 110 may receive transmissions on multiple non-contiguous carriers within the same band.

FIG. 2C shows an example of inter-band CA in the same band group. In the example shown in FIG. 2C, wireless device 110 is configured with four carriers in two bands in the same band group, which is low-band. Wireless device 110 may receive transmissions on multiple carriers in different bands in the same band group (e.g., low-band in FIG. 2C).

FIG. 2D shows an example of inter-band CA in different band groups. In the example shown in FIG. 2D, wireless device 110 is configured with four carriers in two bands in different band groups, which include two carriers in one band in low-band and two additional carriers in another band in mid-band. Wireless device 110 may receive transmissions on multiple carriers in different bands in different band groups (e.g., low-band and mid-band in FIG. 2D).

FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, etc.

Figure 3:
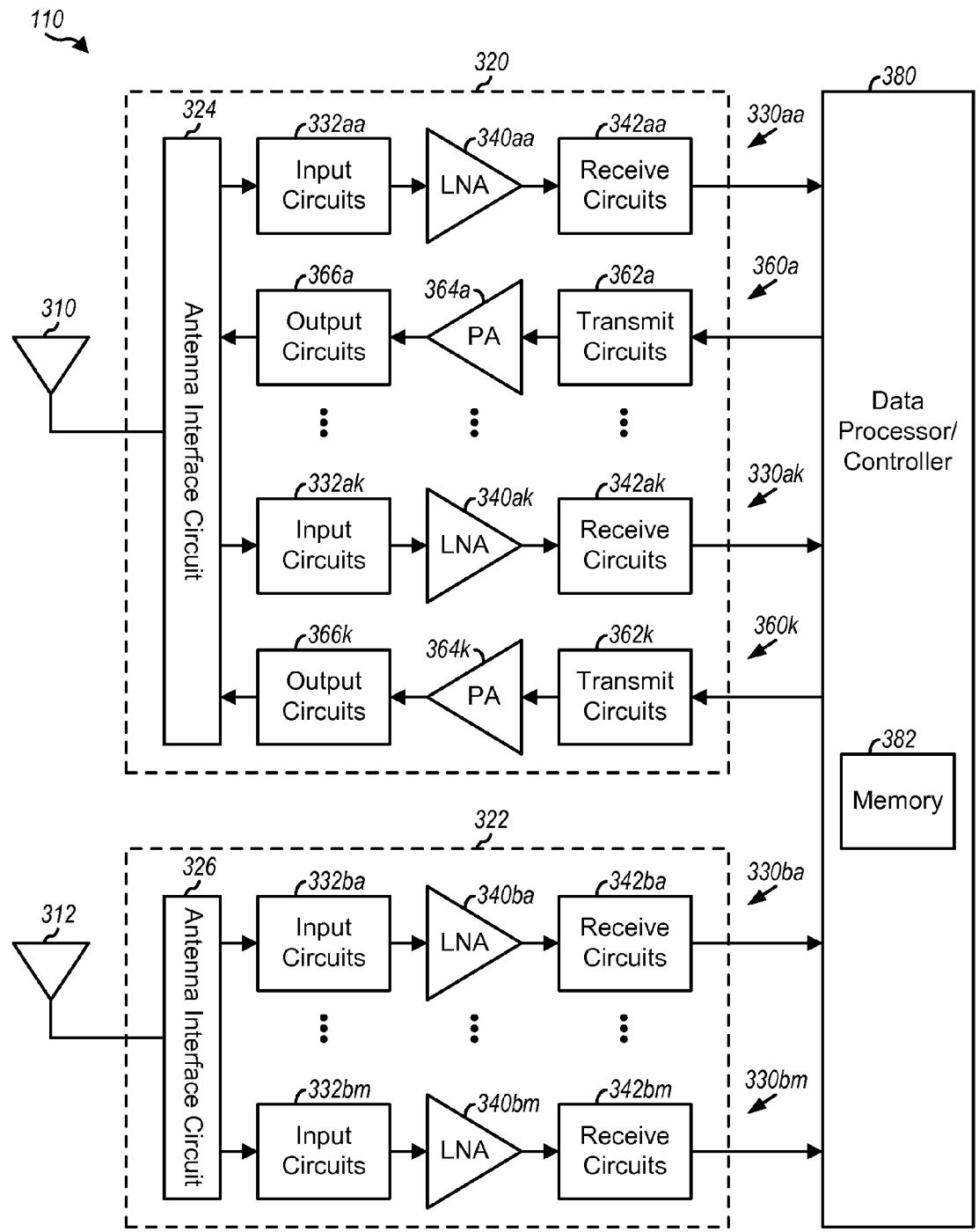
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, receivers 322 coupled to a secondary antenna 312, and a data processor/controller 380. Transceiver 320 includes multiple (K) receivers 330aa to 330ak and multiple (K) transmitters 360a to 360k to support multiple bands, carrier aggregation, multiple radio technologies, etc. Receivers 322 include multiple (M) receivers 330ba to 330bm to support multiple bands, carrier aggregation, multiple radio technologies, receive diversity, MIMO transmission from multiple transmit antennas to multiple receive antennas, etc.

In the exemplary design shown in FIG. 3, each receiver 330 includes input circuits 332, an LNA 340, and receive circuits 342. For data reception, antenna 310 receives signals from base stations and/or other transmitter stations and provides a received RF signal, which is routed through an antenna interface circuit 324 and provided to a selected receiver. Antenna interface circuit 324 may include switches, duplexers, transmit filters, receive filters, etc. The description below assumes that receiver 330aa is the selected receiver. Within receiver 330aa, the received RF signal is passed through input circuits 332aa, which provides an input RF signal to an LNA 340aa. Input circuits 332aa may include a matching circuit, a receive filter, etc. LNA 340aa amplifies the input RF signal and provides an output RF signal. Receive circuits 342aa amplify, filter, and downconvert the output RF signal from RF to baseband and provide an analog input signal to data processor 380. Receive circuits 332aa may include mixers, filters, amplifiers, matching circuits, an oscillator, a local oscillator (LO) generator, a phase locked loop (PLL), etc. Each remaining receiver 330 in transceiver 320 and each receiver 330 in receivers 322 may operate in similar manner as receiver 330aa in transceiver 320.

In the exemplary design shown in FIG. 3, each transmitter 360 includes transmit circuits 362, a power amplifier (PA) 364, and output circuits 366. For data transmission, data processor 380 processes (e.g., encodes and modulates) data to be transmitted and provides an analog output signal to a selected transmitter. The description below assumes that transmitter 360a is the selected transmitter. Within transmitter 360a, transmit circuits 362a amplify, filter, and upconvert the analog output signal from baseband to RF and provide a modulated RF signal. Transmit circuits 362a may include amplifiers, filters, mixers, matching circuits, an oscillator, an LO generator, a PLL, etc. A PA 364a receives and amplifies the modulated RF signal and provides a transmit RF signal having the proper output power level. The transmit RF signal is passed through output circuits 366a, routed through antenna interface circuit 324, and transmitted via antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of transceiver 320 and receivers 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Antenna interface circuits 324 and 326, input circuits 332, output circuits 366, and PAs 364 may be implemented on another module, which may be a hybrid module, etc. The circuits in receivers 330 and transmitters 360 may also be implemented in other manners.

Data processor/controller 380 may perform various functions for wireless device 110. For example, data processor 380 may perform processing for data being received via receivers 330 and data being transmitted via transmitters 360. Controller 380 may control the operation of antenna interface circuits 324 and 326, input circuits 332, LNAs 340, receive circuits 342, transmit circuits 362, PAs 364, output circuits 366, or a combination thereof. A memory 382 may store program codes and data for data processor/controller 380. Data processor/controller 380 may be implemented on one or more application specific integrated circuits (ASICs) and/or other ICs.

Wireless device 110 may receive transmissions from one or more base stations/cells on multiple carriers at different frequencies for carrier aggregation. For intra-band CA, the transmissions are sent on different carriers in the same band. For inter-band CA, the transmissions are sent on multiple carriers in different bands.

Figure 4:
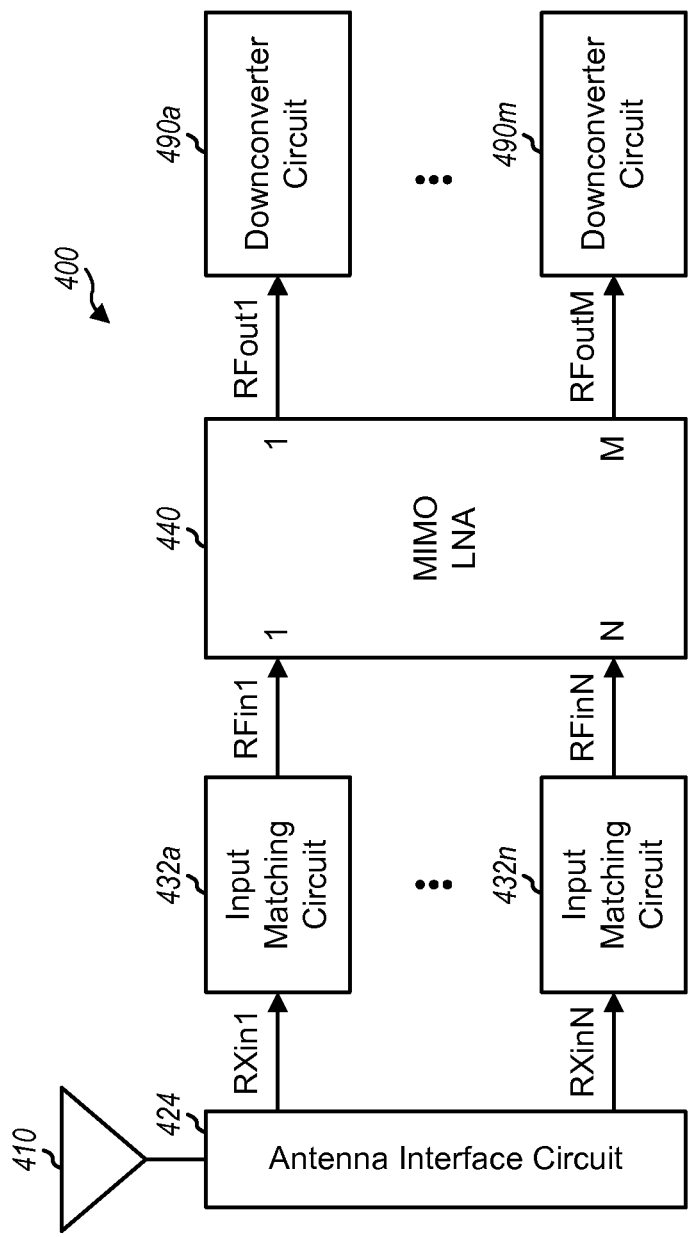
FIG. 4 shows a receiver with a multiple-input multiple-output (MIMO) LNA supporting carrier aggregation.

FIG. 4 shows a block diagram of an exemplary design of a receiver 400 with a MIMO LNA 440 supporting no CA, intra-band CA, and inter-band CA. MIMO LNA 440 may be used for one or more LNAs 340 in FIG. 3. MIMO LNA 440 includes multiple (N) inputs and multiple (M) outputs and may be referred to as an N×M MIMO LNA, where N>1 and M>1.

At receiver 400, an antenna 410 receives downlink signals comprising transmissions sent on multiple carriers in the same band or different bands. Antenna 410 provides a received RF signal to an antenna interface circuit 424. Antenna interface circuit 424 filters and routes the received RF signal and provides up to N receiver input signals, RXin1 to RXinN, to up to N input matching circuits 432a to 432n, respectively. Matching circuits 432a to 432n provide up to N input RF signals, RFin1 to RFinN, respectively, to MIMO LNA 440. Matching circuits 432a to 432n may be part of one or more input circuits 332 in FIG. 3. Each matching circuit 432 performs impedance and/or power matching between MIMO LNA 440 and either antenna interface circuit 424 or antenna 410 for one or more bands of interest. The N matching circuits 432a to 432n may be designed for different bands.

MIMO LNA 440 receives up to N input RF signals and amplifies (i) one input RF signal for no CA or intra-band CA or (i) multiple input RF signals for inter-band CA. MIMO LNA 440 provides (i) one output RF signal via one LNA output for no CA or (ii) up to M output RF signals, RFout1 to RFoutM, via up to M LNA outputs for intra-band CA or inter-band CA. M downconverter circuits 490a to 490m are coupled to the M LNA outputs. Each downconverter circuit 490, when enabled, downconverts an associated output RF signal such that one or more transmissions on one or more carriers of interest are downconverted from RF to baseband.

A MIMO LNA, such as MIMO LNA 440 in FIG. 4, may be used to receive transmissions on multiple carriers at different frequencies. A MIMO LNA may include multiple outputs providing multiple output RF signals for different carriers or different sets of carriers of interest. A MIMO LNA is different from LNAs used to receive a MIMO transmission sent from multiple transmit antennas to multiple receive antennas. An LNA for a MIMO transmission typically has (i) one input receiving one input RF signal from one receive antenna and (ii) one output providing one output RF signal. The multiple outputs of a MIMO LNA thus cover frequency dimension whereas the outputs of LNAs used for a MIMO transmission cover spatial dimension.

Figure 5:
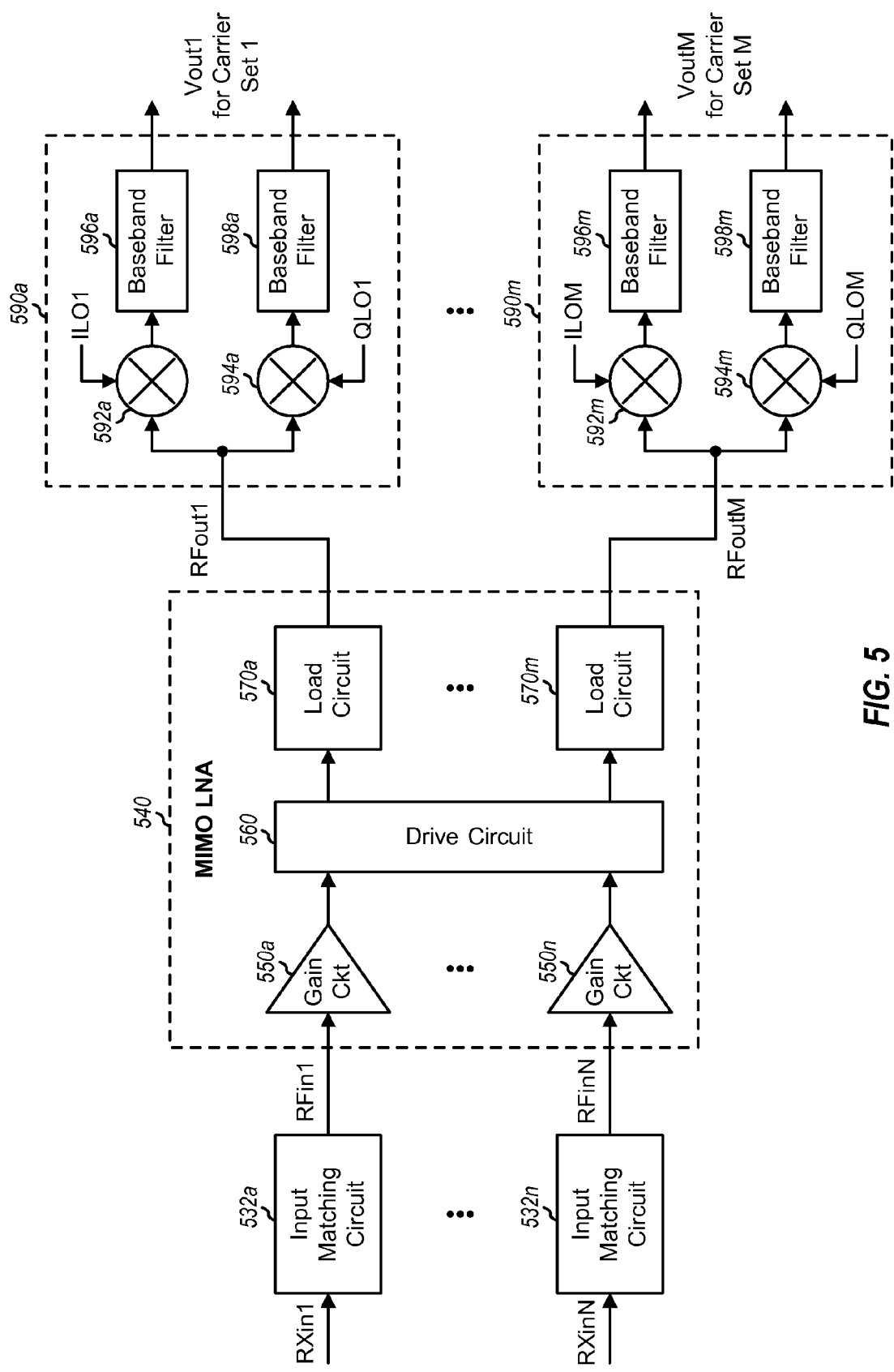
FIG. 5 shows a block diagram of the MIMO LNA in FIG. 4.

FIG. 5 shows a schematic diagram of an exemplary design of a MIMO LNA 540 supporting no CA, intra-band CA, and inter-band CA. MIMO LNA 540 can support CA on multiple sets of carriers in one or more bands. Each set of carriers may include one or more carriers in one band. MIMO LNA 540 is one exemplary design of MIMO LNA 440 in FIG. 4.

N input matching circuits 532a to 532n receive N receiver input signals, RXin1 to RXinN, and provide N input RF signals, RFin1 to RFinN. Matching circuits 532a to 532n may receive (i) the same receiver input signal from one antenna, or (ii) different receiver input signals from one or more antennas. Hence, the RXin1 to RXinN signals may be the same signal or different signals. Each matching circuit 532 performs input matching for one or more bands of interest. For example, the RXin1 to RXinN signals may be the same signal from one antenna, and matching circuits 532a to 532n may perform input matching for different bands. As another example, the RXin1 to RXinN signals may be different signals from different antennas, and matching circuits 532a to 532n may perform input matching for the same band or different bands.

In the exemplary design shown in FIG. 5, MIMO LNA 540 includes N gain circuits (Ckt) 550a to 550n for N LNA inputs, a drive circuit 560, and M load circuits 570a to 570m for M LNA outputs. The N input RF signals RFin1 to RFinN are provide to the N gain circuits 550a to 550n, respectively. L gain circuits 550 may be enabled to receive transmissions on K sets of carriers, where 1≤L≤N and 1≤K≤M. The N–L remaining gain circuits 550 may be disabled. Each enabled gain circuit 550 receives and amplifies its input RF signal and provides a corresponding amplified RF signal. Drive circuit 560 receives L amplified RF signals from L enabled gain circuits 550 and provides K drive RF signals to K load circuits selected from among the M load circuits 570. The K selected load circuits 570 provide K output RF signals to K downconverter circuits 590 coupled to the K load circuits.

In the exemplary design shown in FIG. 5, each downconverter circuit 590 includes two mixers 592 and 594 coupled to two baseband filters 596 and 598, respectively. Within downconverter circuit 590a, a mixer 592a receives a first output RF signal, RFout1, from load circuit 570a within LNA 540 and an inphase LO signal, ILO1, at a first mixing frequency for a first set of carriers. Mixer 592a downconverts the first output RF signal with the ILO1 signal and provides an inphase (I) downconverted signal. A mixer 594a receives the first output RF signal from load circuit 570a and a quadrature LO signal, QLO1, at the first mixing frequency. Mixer 594a downconverts the first output RF signal with the QLO1 signal and provides a quadrature (Q) downconverted signal. Filters 596a and 598a receive and filter the I and Q downconverted signals from mixers 592a and 594a, respectively, and provide I and Q baseband signals, Vout1, for the first set of carriers.

K downconverters 590 may be selected to receive transmission on K sets of carriers. Each downconverter 590 may process and downconvert its output RF signal from LNA 540 and provide I and Q baseband signals for a different set of carriers.

MIMO LNA 540 may be implemented with various circuit architectures. Some exemplary designs of MIMO LNA 540 are described below. MIMO LNA 540 may also be implemented with transistors of various types. Some exemplary designs of MIMO LNA 540 implemented with N-channel metal oxide semiconductor (NMOS) transistors are described below.

Figure 6:
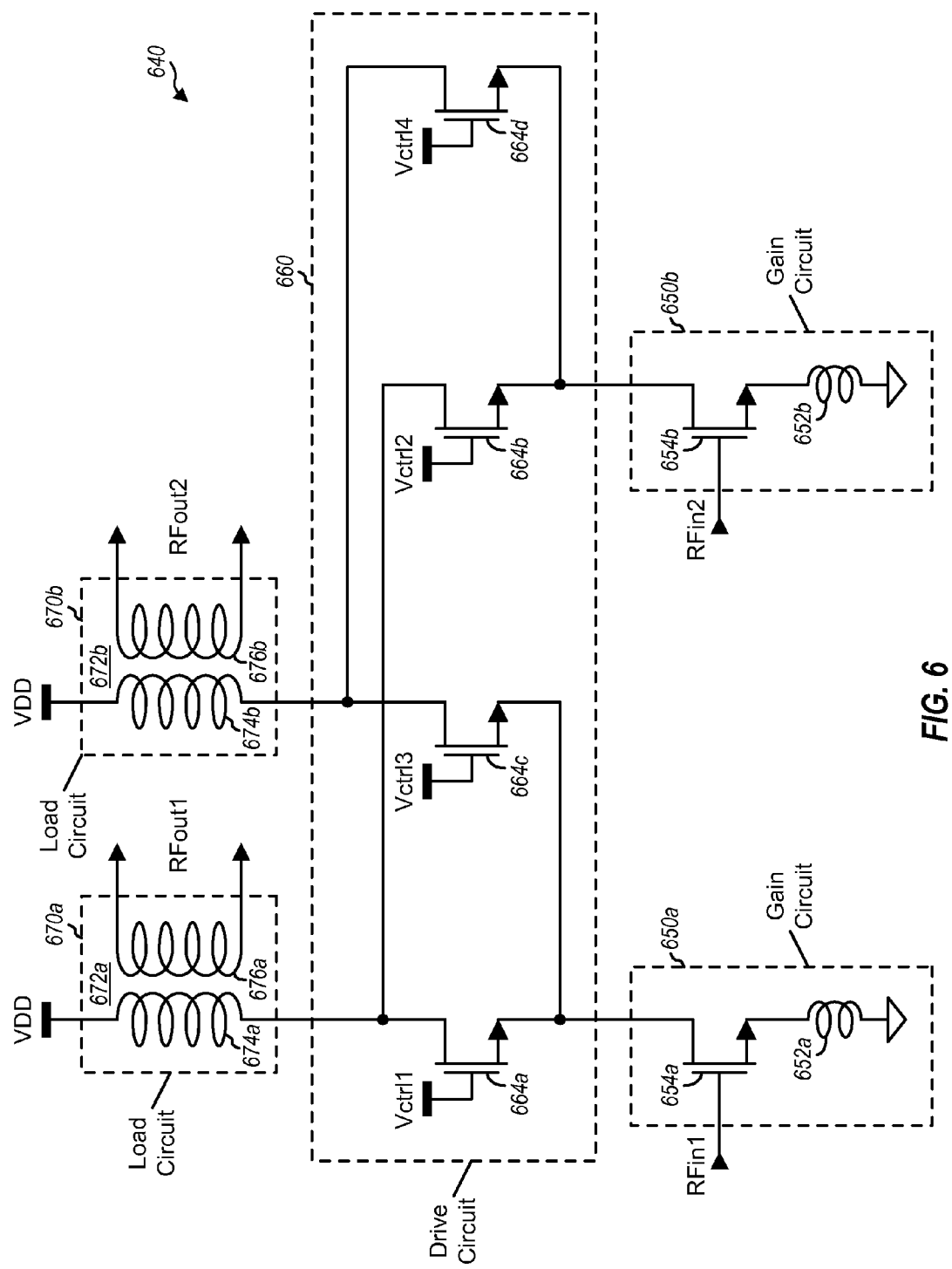
FIG. 6 shows a schematic diagram of a 2×2 MIMO LNA.

FIG. 6 shows a schematic diagram of an exemplary design of a 2×2 MIMO LNA 640 based on a split cascode architecture. MIMO LNA 640 is one exemplary design of MIMO LNA 540 in FIG. 5. MIMO LNA 640 includes two gain circuits 650a and 650b for two LNA inputs, a drive circuit 660, and two load circuits 670a and 670b for two LNA outputs.

In the exemplary design shown in FIG. 6, each gain circuit 650 includes a source degeneration inductor 652 and a gain transistor 654. Within gain circuit 650a, a gain transistor 654a has its gate receiving a first input RF signal, RFin1, and its source coupled to one end of inductor 652a. The other end of inductor 652a is coupled to circuit ground. Gain circuit 650b includes a source degeneration inductor 652b and a gain transistor 654b, which are coupled in similar manner as inductor 652a and transistor 654a in gain circuit 650a. Gain transistors 654a and 654b may be implemented with NMOS transistors, as shown in FIG. 6, or with transistors of other types.

Gain circuits 650 may also be implemented in other manners. In another exemplary design, a gain circuit may include a gain transistor having its source coupled directly to circuit ground (instead of to a source degeneration inductor). In yet another exemplary design, a gain circuit may include two gain transistors coupled in parallel and having their gates receiving an input RF signal. A first gain transistor may have its source coupled to a source degeneration inductor, as shown in FIG. 6. A second gain transistor may have its source coupled directly to circuit ground. Either the first or second gain transistor may be selected.

In the exemplary design shown in FIG. 6, drive circuit 660 includes four cascode transistors 664a to 664d, which receive four control signals Vctrl1 to Vctrl4, respectively, at their gates. Cascode transistors 664a and 664c have their sources coupled to the drain of gain transistor 654a and their drains coupled to load circuits 670a and 670b, respectively. Cascode transistors 664b and 664d have their sources coupled to the drain of gain transistor 654b and their drains coupled to load circuits 670a and 670b, respectively. Cascode transistors 664 may be implemented with NMOS transistors, as shown in FIG. 6, or transistors of other types. Drive circuit 660 may also be implemented in other manners, as described below.

In the exemplary design shown in FIG. 6, each load circuit 670 includes a transformer 672 comprising a primary coil 674 and a secondary coil 676. Within load circuit 670a, a transformer 672a includes (i) a primary coil 674a coupled between the drains of cascode transistors 664a and 664b and a power supply, VDD, and (ii) a secondary coil 676a providing a differential first output RF signal. Load circuit 670b includes a transformer 672b having (i) a primary coil 674b coupled between the drains of cascode transistors 664c and 664d and the VDD supply and (ii) a secondary coil 676b providing a differential second output RF signal.

Load circuits 670 may also be implemented in other manners. In another exemplary design, a load circuit may include an inductor and possibly a capacitor coupled between the VDD supply and the drains of one or more cascode transistors. The cascode transistors may provide the output RF signals at their drains. In yet another exemplary design, a load circuit may include a P-channel metal oxide semiconductor (PMOS) transistor having its source coupled to the VDD supply and its drain coupled to the drains of one or more cascode transistors. The PMOS transistor may provide an active load for the one or more cascode transistors.

In an exemplary design, gain circuits 650a and 650b may each be enabled (i.e., turned on) or disabled (i.e., turned off). Each gain circuit 650 may be (i) disabled by applying a low voltage to the gate of gain transistor 654 within that gain circuit 650 or (ii) enabled by applying a suitable bias voltage to the gate of gain transistor 654. In one exemplary design, an input RF signal may be applied directly to the gate of gain transistor 654, as shown in FIG. 6, and may be pulled to a low voltage to disable gain circuit 650. In another exemplary design, the input RF signal may be applied to the gate of gain transistor 654 via an AC coupling/DC blocking capacitor (not shown in FIG. 6). A bias voltage may then be applied to the gate of gain transistor 654 via a resistor and may be set to a low voltage to disable gain circuit 650.

In an exemplary design, cascode transistors 664a to 664d within drive circuit 660 may each be enabled (i.e., turned on) or disabled (i.e., turned off). Each cascode transistor 664 may be (i) disabled by applying a low voltage to the gate of cascode transistor 664 or (ii) enabled by applying a suitable bias voltage to the gate of cascode transistor 664. The Vctrl signal applied to the gate of each cascode transistor 664 may thus disable the cascode transistor or provide the proper bias voltage to enable the cascode transistor.

MIMO LNA 640 may support a single-output mode, an intra-band CA mode, and an inter-band CA mode. In the single-output mode, a single input RF signal is applied to a single gain circuit 650. A single output RF signal for one set of carriers is provided by a single load circuit 670. The single-output mode may be used to receive transmission sent on a single carrier without carrier aggregation. The single-output mode may also be used to receive transmissions sent on multiple carriers (e.g., contiguous carriers) with carrier aggregation. In this case, the transmissions on all carriers may be downconverted with a single LO signal at a single frequency. In the intra-band CA mode, a single input RF signal is applied to a single gain circuit 650. Two output RF signals for two sets of carriers are provided by two load circuits 670. In the inter-band CA mode, two input RF signals for two bands are applied to two gain circuits 650. Two output RF signals for two sets of carriers are provided by two load circuits 670.

Figure 7A:
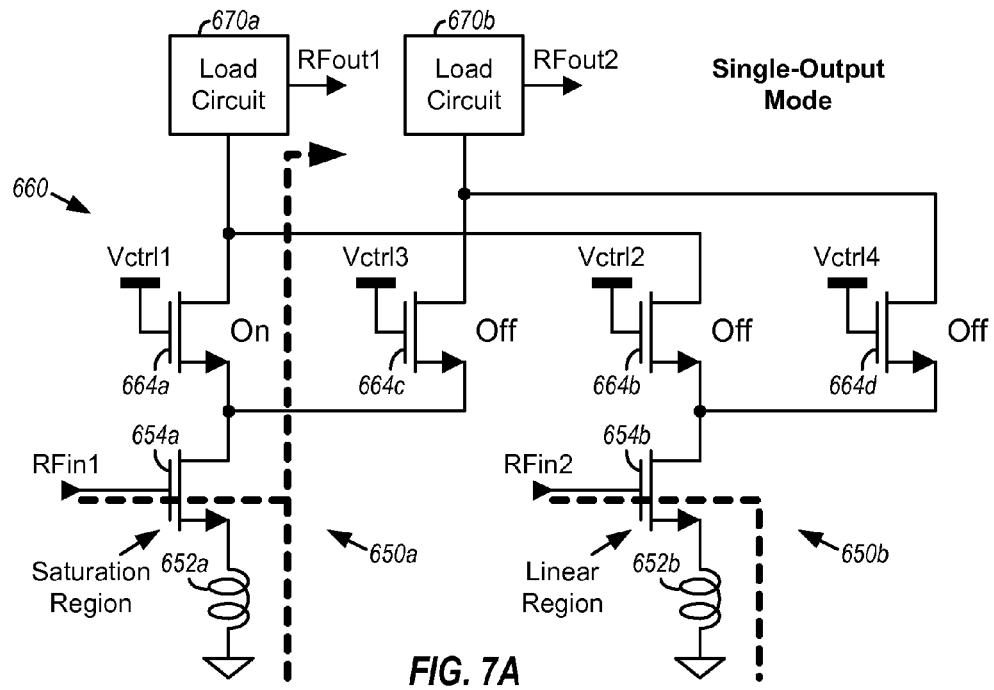
FIGS. 7A, 7B and 7C show operation of the 2×2 MIMO LNA in FIG. 6 in a single-output mode, an intra-band CA mode, and an inter-band CA mode, respectively.

FIG. 7A shows operation of MIMO LNA 640 in FIG. 6 in the single-output mode. In this mode, MIMO LNA 640 operates in a 1×1 configuration with one LNA input and one LNA output. Either gain circuit 650a or 650b may be enabled to amplify a single input RF signal for a band of interest. Either load circuit 670a or 670b may be selected to provide a single output RF signal for a set of carriers of interest. One cascode transistor 664 within drive circuit 660 may be turned on to buffer an amplified RF signal from the selected gain circuit 650 and drive the selected load circuit 670. In the example shown in FIG. 7A, gain circuit 650a is selected to amplify the RFin1 signal, and cascode transistor 664a is turned on to buffer the amplified RF signal from gain circuit 650a and drive selected load circuit 670a. Gain circuit 650b as well as cascode transistors 664b to 664d are turned off. Enabled gain circuit 650a operates in a saturation region with the input RF signal applied to its gate and a bias current provided by cascode transistor 664a. Disabled gain transistor 650b operates in a linear region with the input RF signal applied to its gate but no bias current provided by any cascode transistor.

Figure 7B:
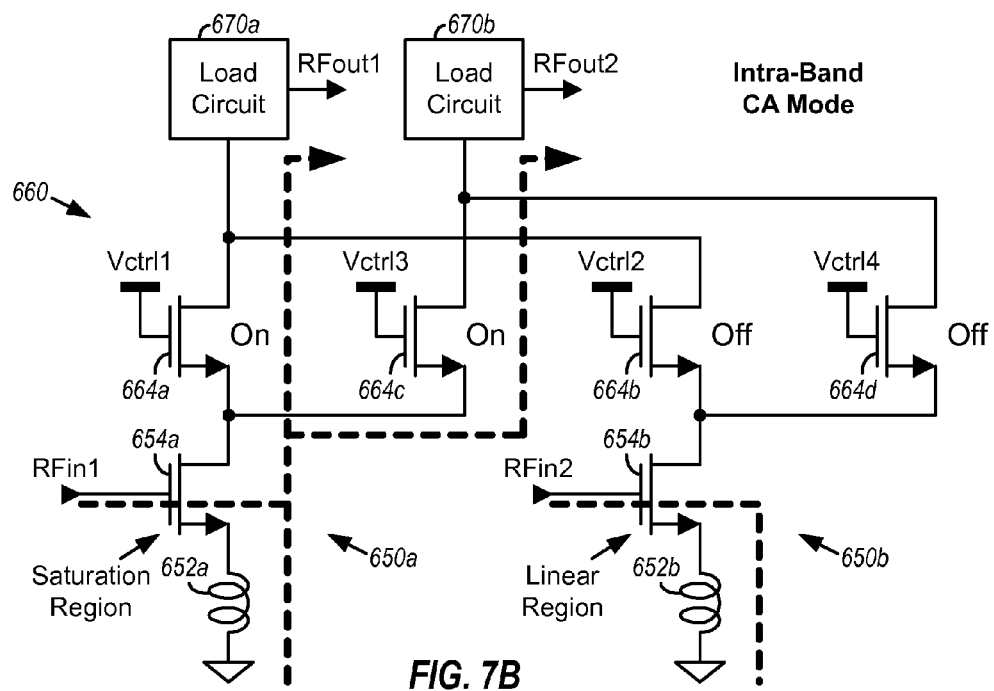

FIG. 7B shows operation of MIMO LNA 640 in the intra-band CA mode. In this mode, MIMO LNA 640 operates in a 1×2 configuration with one LNA input and two LNA outputs. Either gain circuit 650a or 650b may be enabled to amplify a single input RF signal for a band of interest. Both load circuits 670a and 670b may be selected to provide two output RF signals for two sets of carriers of interest. Two cascode transistors 664 within drive circuit 660 may be turned on to buffer the amplified RF signal from the selected gain circuit 650 and drive the two load circuits 670. In the example shown in FIG. 7B, gain circuit 650a is selected to amplify the RFin1 signal, and cascode transistors 664a and 664c are turned on to buffer the amplified RF signal from gain circuit 650a and drive load circuits 670a and 670b. Gain circuit 650b as well as cascode transistors 664b and 664d are turned off.

Figure 7C:
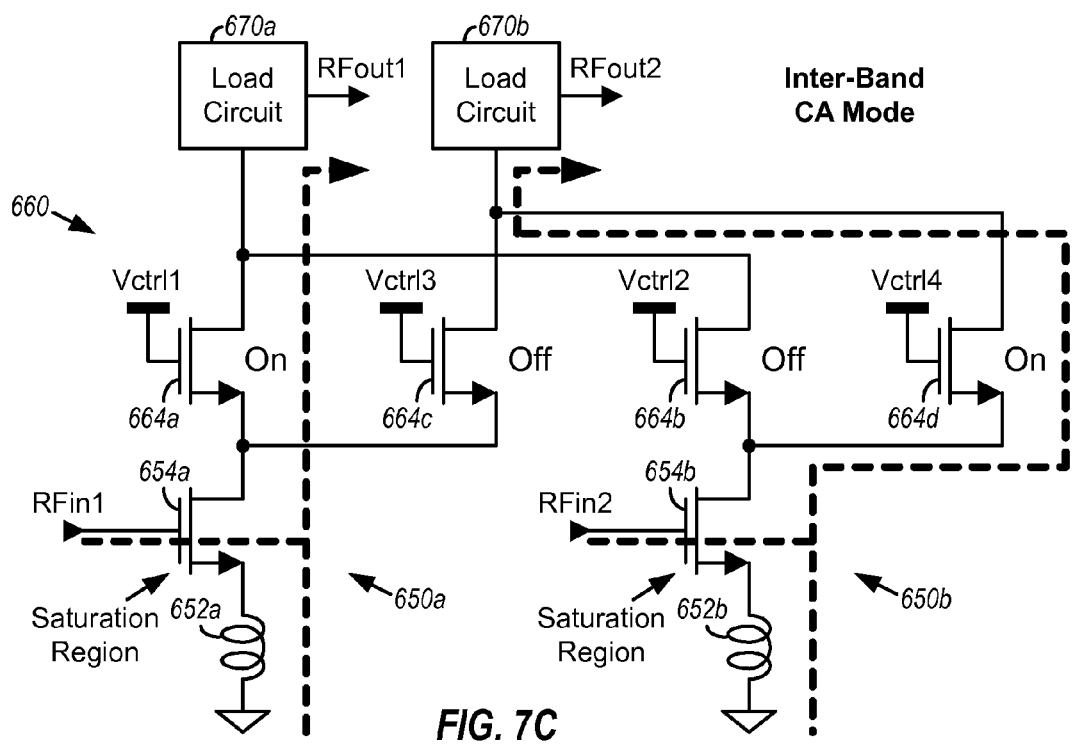

FIG. 7C shows operation of MIMO LNA 640 in the inter-band CA mode. In this mode, MIMO LNA 640 operates in a 2×2 configuration with two LNA inputs and two LNA outputs. Both gain circuits 650a or 650b may be enabled to amplify two input RF signals for one or two bands of interest. Both load circuits 670a and 670b may be selected to provide two output RF signals for two sets of carriers of interest. Two cascode transistors 664 within drive circuit 660 may be turned on to buffer the two amplified RF signals from the two gain circuits 650 and drive the two load circuits 670. In the example shown in FIG. 7C, cascode transistors 664a and 664d are turned on to buffer the amplified RF signals from gain circuits 650a and 650b, respectively, and drive load circuits 670a and 670b, respectively. Cascode transistors 664b and 664c are turned off.

As shown in FIGS. 6 to 7C, in the split cascode architecture, an input RF signal may be amplified by a gain transistor and may be split at the cascode level by providing the amplified RF signal from the gain transistor to multiple cascode transistors. When two cascode transistors are coupled to one gain transistor as shown in FIG. 6, the split cascode architecture may have approximately 6 decibel (dB) lower gain in a CA mode for a given amount of bias current. The lower gain may be accounted for in subsequent circuits.

Figure 8A:
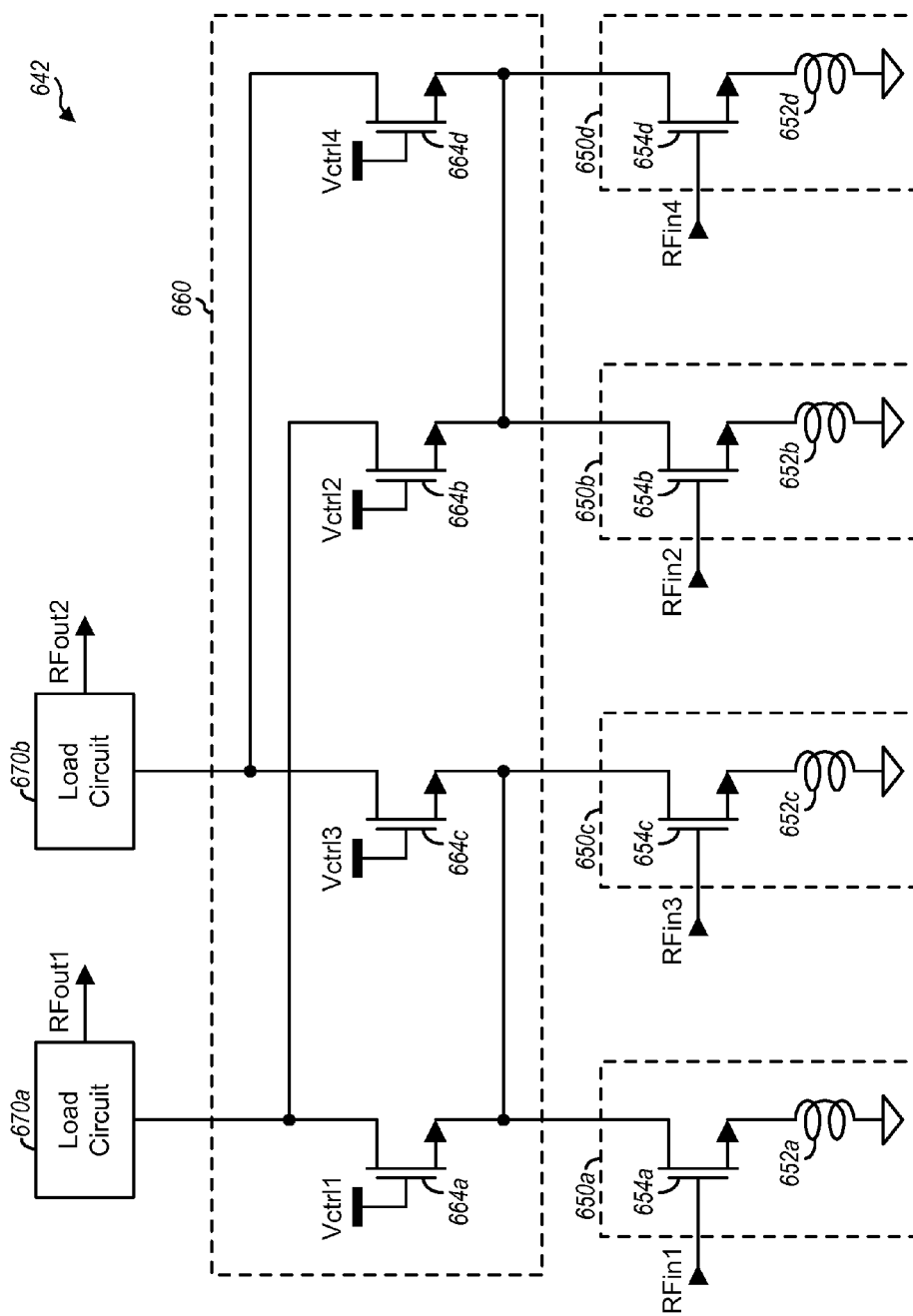
FIGS. 8A to 8D show four exemplary designs of a 4×2 MIMO LNA.

FIG. 8A shows a schematic diagram of an exemplary design of a 4×2 MIMO LNA 642 based on the split cascode architecture. MIMO LNA 642 is another exemplary design of MIMO LNA 540 in FIG. 5. MIMO LNA 642 includes four gain circuits 650a to 650d for four LNA inputs, drive circuit 660, and two load circuits 670a and 670b for two LNA outputs. Gain circuits 650a and 650b, drive circuit 660, and load circuits 670a and 670b are coupled as described above for FIG. 6. Within gain circuit 650c, a gain transistor 654c has its gate receiving a third input RF signal, RFin3, its source coupled to one end of an inductor 652c, and its drain coupled to the source of cascode transistor 664c. The other end of inductor 652c is coupled to circuit ground. Gain circuit 650d includes a source degeneration inductor 652d and a gain transistor 654d, which are coupled in similar manner as inductor 652c and transistor 654c in gain circuit 650c. The drain of gain transistor 654d is coupled to the source of cascode transistor 664d.

MIMO LNA 642 may support the single-output mode, the intra-band CA mode, and the inter-band CA mode. In the single-output mode, a single input RF signal may be received via one of the four LNA inputs and applied to a single gain circuit 650. A single output RF signal for one set of carriers may be provided by a single load circuit 670 to one of the two LNA outputs. MIMO LNA 642 can support the single-output mode with an input RF signal applied to any one of the four gain circuits 650.

In the intra-band CA mode, a single input RF signal may be received via one of the four LNA inputs and applied to a single gain circuit 650. Two output RF signals for two sets of carriers may be provided by two load circuits 670 to the two LNA outputs. MIMO LNA 642 can allow an input RF signal to be applied to any gain circuit 650 and routed to any load circuit 670.

In the inter-band CA mode, two input RF signals for two bands may be received via two of the four LNA inputs and applied to two gain circuits 650. Two output RF signals for two sets of carriers may be provided by two load circuits 670 to the two LNA outputs. In the exemplary design shown in FIG. 8A, MIMO LNA 642 can support four combinations of input RF signals in the inter-band CA mode. In particular, the following combinations of input RF signals may be support: (RFin1, RFin2), (RFin1, RFin4), (RFin2, RFin3), and (RFin3, RFin4). The combination (RFin1, RFin3) is not supported since the RFin1 and RFin3 signals are provided to gain transistors 654a and 654c having their drains coupled together. Similarly, the combination (RFin2, RFin4) is not supported since the RFin2 and RFin4 signals are provided to gain transistors 654b and 654d having their drains coupled together.

Figure 8B:
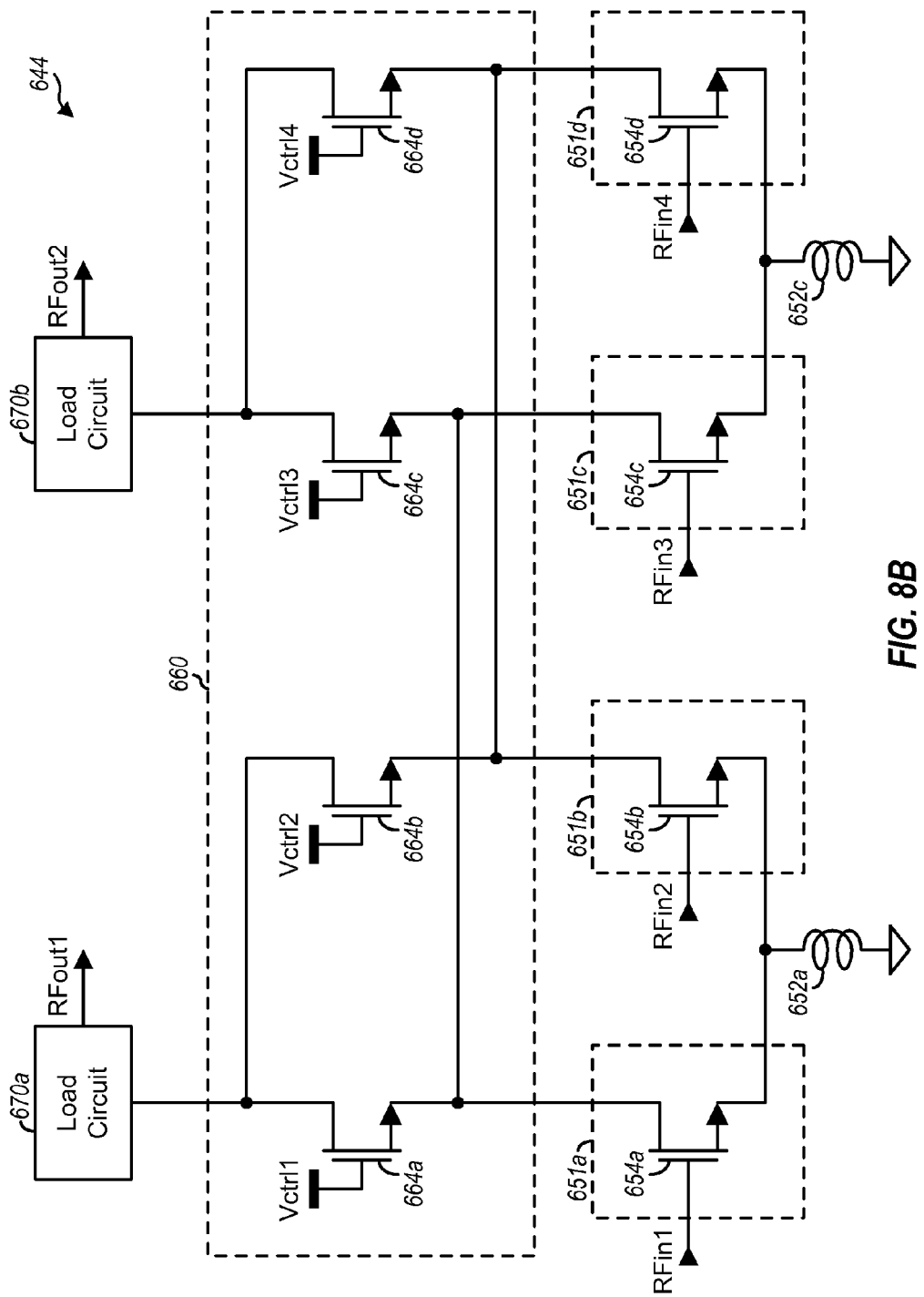

FIG. 8B shows a schematic diagram of an exemplary design of a 4×2 MIMO LNA 644 based on the split cascode architecture. MIMO LNA 644 is yet another exemplary design of MIMO LNA 540 in FIG. 5. MIMO LNA 644 includes four gain circuits 651a to 651d for four LNA inputs, drive circuit 660, and two load circuits 670a and 670b for two LNA outputs. Each gain circuit 651 includes a gain transistor 654, which is coupled to a source degeneration inductor 652. Gain transistors 654a and 654b share the same source degeneration inductor 652a. Similarly, gain transistors 654c and 654d share the same source degeneration inductor 652c. MIMO LNA 644 in FIG. 8B includes half of the source degeneration inductors as MIMO LNA 642 in FIG. 8A, which may provide some advantages such as smaller circuit area, lower cost, etc.

MIMO LNA 644 may support the single-output mode and the intra-band CA mode as described above for MIMO LNA 642 in FIG. 8A. MIMO LNA 644 may also support the inter-band CA mode. However, only one of gain transistors 654a and 654b may be selected since they share the same source degeneration inductor 652a. Similarly, only one of gain transistors 654c and 654d may be selected since they share the same source degeneration inductor 652c. Furthermore, only one of gain transistors 654a and 654c may be selected since their drains are coupled together, and only one of gain transistors 654b and 654d may be selected since their drains are also coupled together. Hence, LNA 644 may support two combinations of input RF signals, (RFin1, RFin4) and (RFin2, RFin3), in the inter-band CA mode.

Figure 8C:
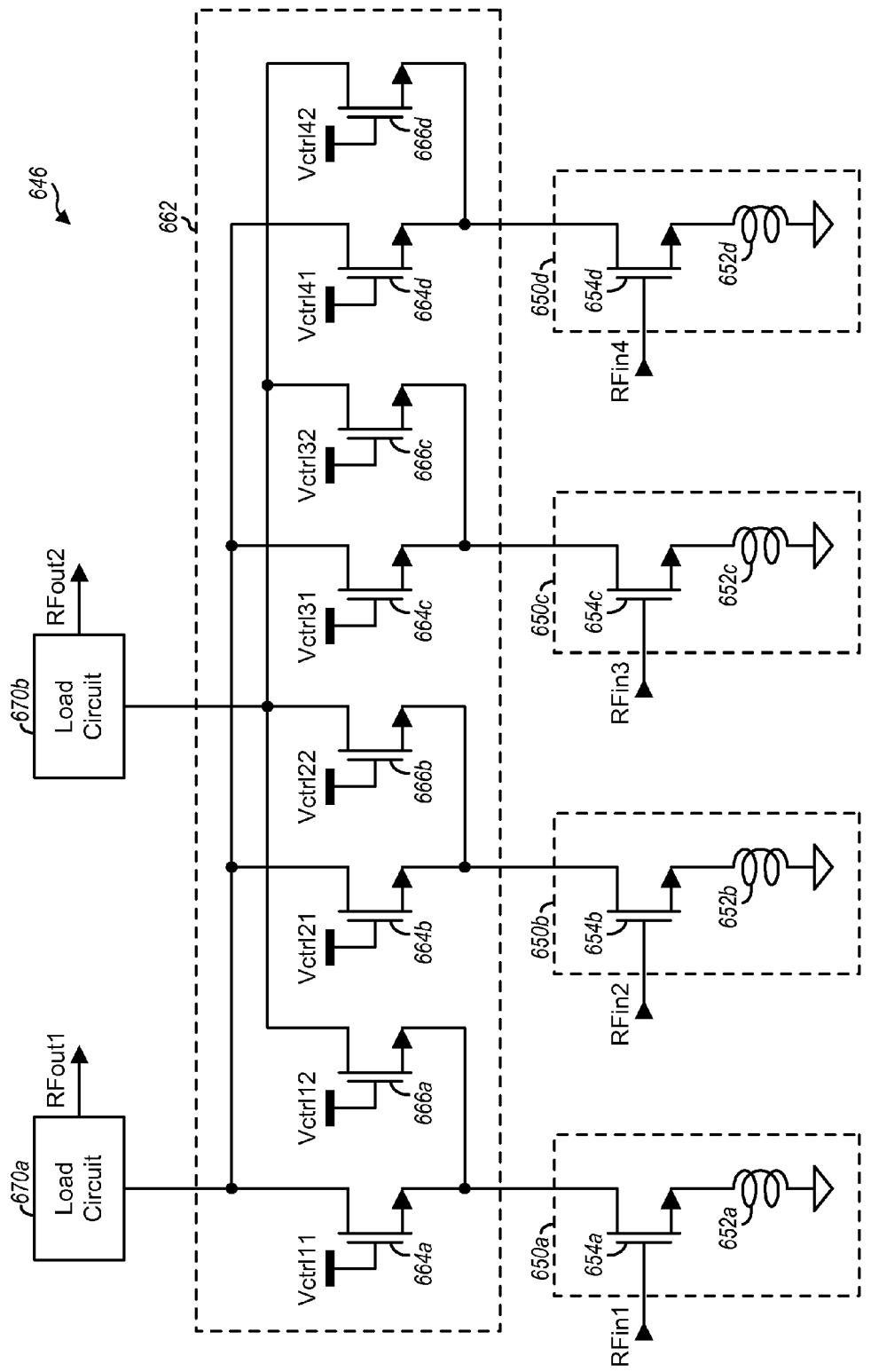

FIG. 8C shows a schematic diagram of an exemplary design of a 4×2 MIMO LNA 646 based on the split cascode architecture. MIMO LNA 646 is yet another exemplary design of MIMO LNA 540 in FIG. 5. MIMO LNA 646 includes four gain circuits 650a to 650d for four LNA inputs, a drive circuit 662, and two load circuits 670a and 670b for two LNA outputs. Drive circuit 662 includes cascode transistors 664a to 664d having their sources coupled to gain circuits 650a to 650d, respectively, and their drains coupled to load circuit 670a. Drive circuit 662 further includes cascode transistors 666a to 666d having their sources coupled to gain circuits 650a to 650d, respectively, and their drains coupled to load circuit 670b.

MIMO LNA 646 may support the single-output mode and the intra-band CA mode as described above for MIMO LNA 642 in FIG. 8A. MIMO LNA 646 may also support the inter-band CA mode. In this mode, two input RF signals may be applied to any two gain circuits 650 since each gain circuit 650 is coupled to both load circuits 670a and 670b via two cascode transistors 664 and 666. Hence, LNA 646 may support all six possible combinations of input RF signals, (RFin1, RFin2), (RFin1, RFin3), (RFin1, RFin4), (RFin2, RFin3), (RFin2, RFin4), and (RFin3, RFin4), in the inter-band CA mode.

Figure 8D:
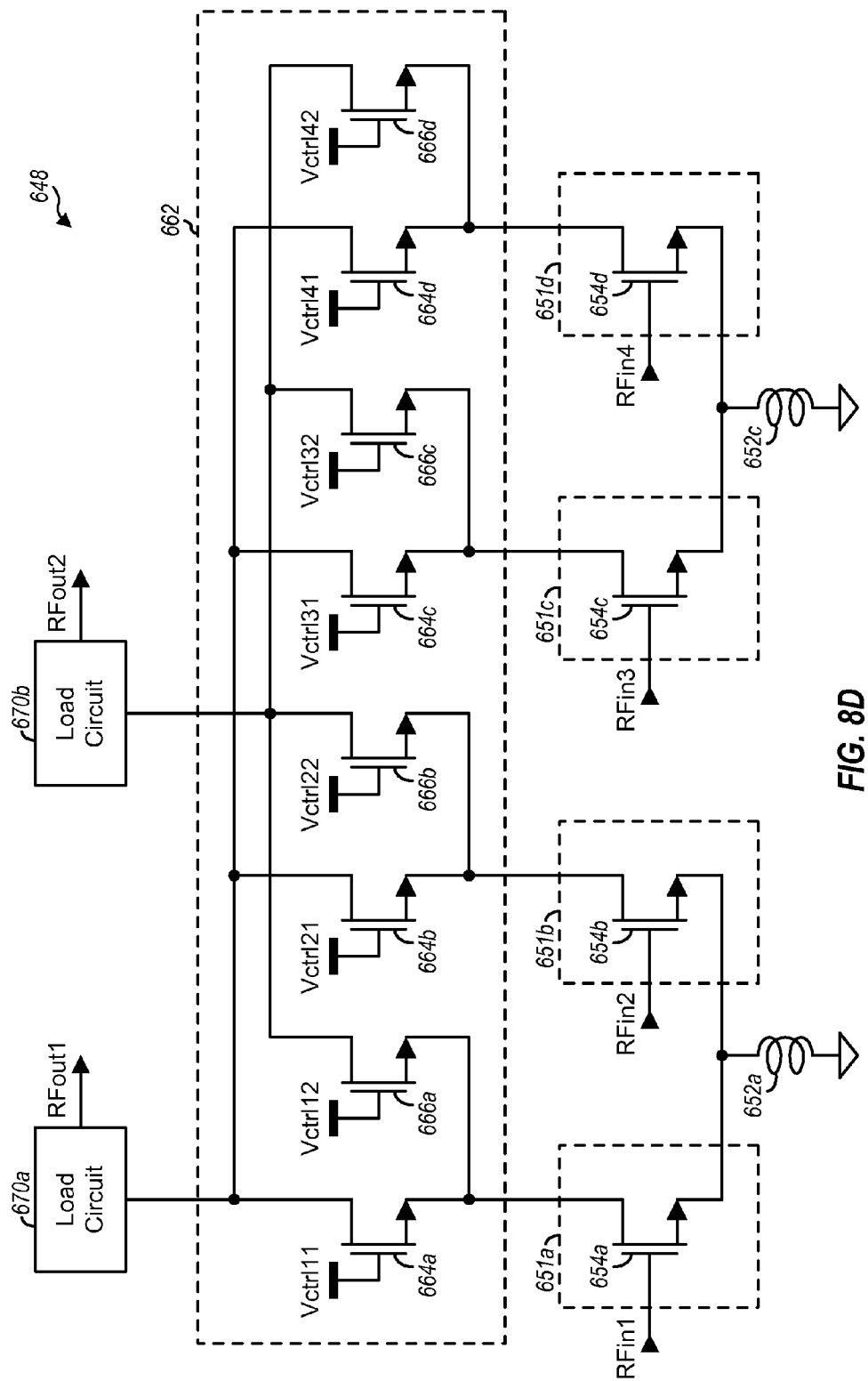

FIG. 8D shows a schematic diagram of an exemplary design of a 4×2 MIMO LNA 648 based on the split cascode architecture. MIMO LNA 648 is yet another exemplary design of MIMO LNA 540 in FIG. 5. MIMO LNA 648 includes four gain circuits 651a to 651d for four LNA inputs, two source degeneration inductors 652a and 652c, drive circuit 662, and two load circuits 670a and 670b for two LNA outputs. Gain circuits 651a to 651d include gain transistors 654a to 654d, which are coupled as described above for FIG. 8B. Drive circuit 662 includes cascode transistors 664a to 664d and cascode transistors 666a to 666d, which are coupled as described above for FIG. 8C.

MIMO LNA 648 may support the single-output mode and the intra-band CA mode as described above for MIMO LNA 642 in FIG. 8A. MIMO LNA 648 may also support the inter-band CA mode. In this mode, two input RF signals may be applied to any two gain circuits 651 not sharing the same source degeneration inductor 652. Hence, LNA 648 may support four combinations of input RF signals, (RFin1, RFin3), (RFin1, RFin4), (RFin2, RFin3) and (RFin2, RFin4), in the inter-band CA mode.

FIGS. 8A to 8D show four exemplary designs of a 4×2 MIMO LNA based on the split cascode architecture. In general, a MIMO LNA may include any number of inputs and any number of outputs.

Figure 9A:
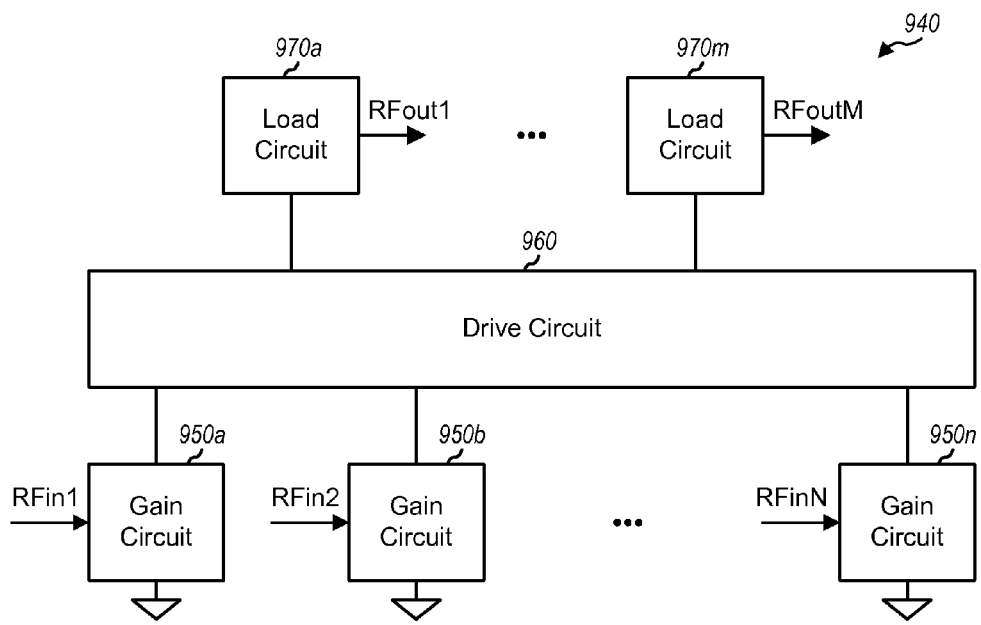
FIGS. 9A and 9B show two exemplary designs of an N×M MIMO LNA.

FIG. 9A shows a schematic diagram of an exemplary design of an N×M MIMO LNA 940, where N and M may each be any integer value greater than one. MIMO LNA 940 is another exemplary design of MIMO LNA 540 in FIG. 5. MIMO LNA 940 includes N gain circuits 950a to 950n for N LNA inputs, a drive circuit 960, and M load circuits 970a to 970m for M LNA outputs. In one exemplary design, each gain circuit 950 may be implemented with a gain transistor having it source coupled to an inductor, e.g., as shown by gain circuit 650a in FIG. 6. In another exemplary design, each gain circuit 950 may be implemented with a gain transistor having its source coupled to circuit ground. In yet another exemplary design, multiple gain circuits 950 may be implemented with gain transistors having their sources coupled to a shared inductor, e.g., as shown in FIG. 8B.

Drive circuit 960 may include cascode transistors coupled between gain circuits 950a to 950n and load circuits 970a to 970m. The number of cascode transistors may be dependent on the desired interconnection between the N gain circuits 950 and the M load circuits 970. In one exemplary design, which may be referred to as "full" interconnection, each gain circuit 950 may be coupled to each load circuit 970 via a cascode transistor. M cascode transistors may thus be coupled between each gain circuit 950 and the M load circuits 970a to 970m, e.g., as shown in FIG. 8C. A total of N*M cascode transistors may be used to implement full interconnection. For full interconnection, up to M input RF signals may be applied to up to M gain circuits to generate up to M output RF signals at up to M load circuits. In another exemplary design, each gain circuit 950 may be coupled to one load circuit 970 via a cascode transistor, e.g., as shown in FIG. 8A. In yet another exemplary design, each gain circuit 950 may be coupled to at least two load circuits 970 via at least two cascode transistors, e.g., as shown in FIG. 8C.

MIMO LNA 940 may support the single-output mode, the intra-band CA mode, and the inter-band CA mode. In the single-output mode, a single input RF signal may be received via one of the N LNA inputs and applied to a single gain circuit 950. A single output RF signal for one set of carriers may be provided by a single load circuit 970 to one of the M LNA outputs. In the intra-band CA mode, a single input RF signal may be received via one of the N LNA inputs and applied to a single gain circuit 950. Multiple output RF signals for multiple sets of carriers may be provided by multiple load circuits 970 to multiple LNA outputs. In the inter-band CA mode, multiple input RF signals for multiple bands may be received via multiple LNA inputs and applied to multiple gain circuits 950. Multiple output RF signals for multiple sets of carriers may be provided by multiple load circuits 970 to multiple LNA outputs.

Figure 9B:
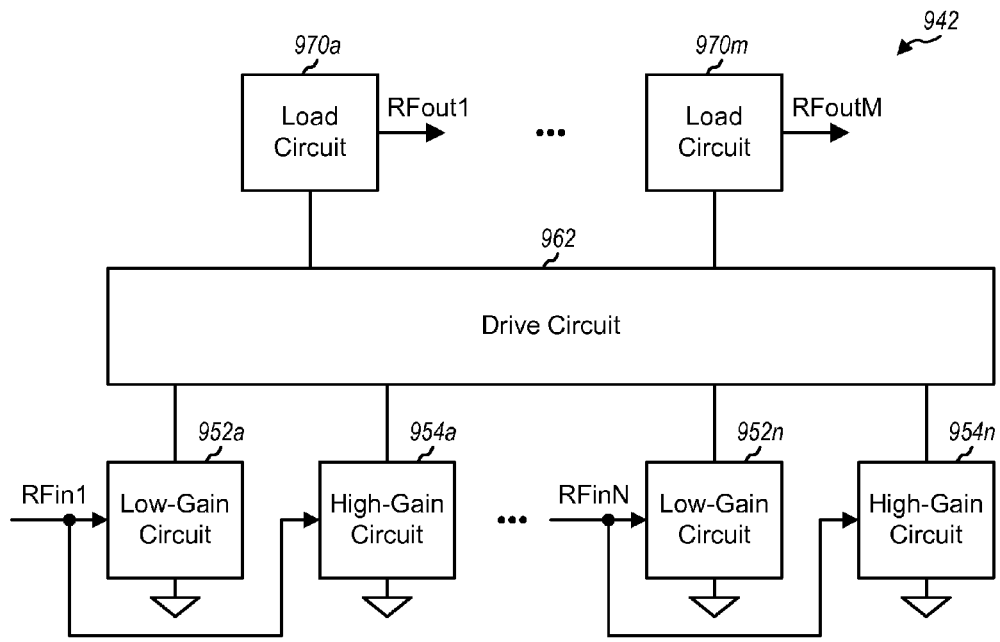

FIG. 9B shows a schematic diagram of an exemplary design of an N×M MIMO LNA 942, where N and M may each be any integer value greater than one. MIMO LNA 942 is another exemplary design of MIMO LNA 540 in FIG. 5. MIMO LNA 942 includes N low-gain circuits 952a to 952n and N high-gain circuits 954a to 954n for N LNA inputs, a drive circuit 962, and M load circuits 970a to 970m for M LNA outputs. In one exemplary design, each high-gain circuit 954 may be implemented with a gain transistor having it source coupled to an inductor, e.g., as shown by gain circuit 650a in FIG. 6. In another exemplary design, multiple high-gain circuits 954 may be implemented with gain transistors having their sources coupled to a shared inductor, e.g., as shown in FIG. 8B. Each low-gain circuit 952 may be implemented as described below. Drive circuit 962 may include cascode transistors coupled between low-gain circuits 952a to 952n and high-gain circuits 954a to 954n and load circuits 970a to 970m. The number of cascode transistors may be dependent on the desired interconnection between gain circuits 952 and 954 and load circuits 970.

MIMO LNA 942 may support the single-output mode, the intra-band CA mode, and the inter-band CA mode, e.g., as described above for MIMO LNA 940 in FIG. 9A. MIMO LNA 942 may also support a high-gain mode and a low-gain mode. In the high-gain mode, one or more high-gain circuits 954 may be selected to amplify one or more input RF signals and provide one or more amplified RF signals. In the low-gain mode, one or more low-gain circuits 952 may be selected to amplify one or more input RF signals and provide one or more amplified RF signals. Drive circuit 962 may receive one or more amplified RF signals from one or more high-gain circuits 954 and/or one or more low-gain circuits 952 and may provide one or more drive signals for one or more load circuits 970.

Figure 10:
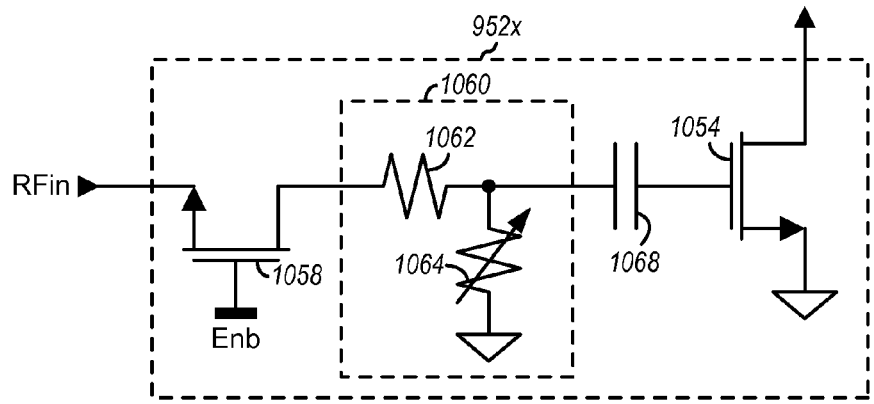
FIG. 10 shows an exemplary design of a low-gain circuit for a MIMO LNA.

FIG. 10 shows a schematic diagram of an exemplary design of a low-gain circuit 952x. Low-gain circuit 952x may be used for any one of low-gain circuits 952a to 952n in FIG. 9B. Within low-gain circuit 952x, an NMOS transistor 1058 has its source coupled to the input of low-gain circuit 952x, its gate receiving a control signal, Enb, and its drain coupled to the input of an attenuation circuit 1060. Attenuation circuit 1060 includes (i) a resistor 1062 coupled between the input and output of attenuation circuit 1060 and (ii) a variable resistor 1064 coupled between the output of attenuation circuit 1060 and circuit ground. An AC coupling capacitor 1068 is coupled between the output of attenuation circuit 1060 and the gate of an NMOS transistor 1054. NMOS transistor 1054 has its source coupled to circuit ground and its drain providing an amplified RF signal when low-gain circuit 952x is enabled.

NMOS transistor 1058 operates as a switch that can pass an input RF signal to NMOS transistor 1054 when NMOS transistor 1058 is enabled by the Enb signal. Attenuation circuit 1060 can attenuate the input RF signal by a variable amount based on the setting of variable resistor 1064. NMOS transistor 1054 is a gain transistor that can amplify the RF signal from attenuation circuit 1060.

A high-gain circuit may be implemented with a gain transistor having its source coupled to a degeneration inductor, e.g., as shown in FIG. 6. A high-gain circuit may also be implemented with (i) a gain transistor having its source coupled to circuit ground and (ii) a feedback circuit coupled between the drain of a cascode transistor and the gate of the gain transistor. The feedback circuit may include a resistor coupled in series with a capacitor. A switch may also be coupled in series with the resistor and the capacitor and may be used to connect or disconnect the feedback circuit. The feedback circuit may help with the input matching and linearity.

The MIMO LNAs described herein may include various desirable features including:
 1. Single-ended LNA inputs and differential LNA outputs,
 2. Transformer/inductive loads for MIMO LNA, and
 3. Inductive degeneration at LNA inputs for high gain and bypassed for low gain.

Single-ended LNA inputs may reduce the number of input ports as well as the number of circuit components for input matching circuits on a printed circuit board (PCB) containing a MIMO LNA. Alternatively, a MIMO LNA may support twice as many receive paths for a given number of input ports with single-ended LNA inputs. Differential LNA outputs may reduce LO leakage and second-order effects by balancing the signals in downconverter circuits. In general, all advantages of differential circuits versus single-ended circuits may be obtained with the differential LNA outputs.

Transformer/inductive loads may allow a MIMO LNA to operate with a low power supply voltage since these circuit components do not waste any voltage headroom. Other types of loads (e.g., active/transistor loads) may degrade gain, noise figure, and linearity of the MIMO LNA.

Inductive degeneration may be used to improve linearity in high-gain LNA as well as to aid input matching to a target impedance (e.g., 50 Ohms). Without degeneration inductors, receiver performance (e.g., for input matching and linearity) may not meet specification requirements.

In an exemplary design, an apparatus (e.g., a wireless device, an IC, a circuit module, etc.) may include a plurality of gain circuits, a drive circuit, and a plurality of load circuits. The plurality of gain circuits (e.g., gain circuits 650 in FIG. 6 or 8A) may receive at least one input RF signal and provide at least one amplified RF signal. Each gain circuit may receive and amplify one input RF signal and providing one amplified RF signal when the gain circuit is enabled. The at least one input RF signal may comprise transmissions sent on multiple carriers at different frequencies to the wireless device. The drive circuit (e.g., drive circuit 660 in FIG. 6 or FIG. 8A) may be coupled to the plurality of gain circuits and the plurality of load circuits. The drive circuit may receive the at least one amplified RF signal and provide at least one drive RF signal. The plurality of load circuits (e.g., load circuits 670 in FIG. 6 or 8A) may receive the at least one drive RF signal and provide at least one output RF signal.

In one exemplary design, each gain circuit may comprise a gain transistor (e.g., NMOS transistor 654 in FIG. 6 or 8A) that receives an input RF signal and provides an amplified RF signal when the gain circuit is enabled. In an exemplary design, a gain circuit (e.g., gain circuit 650*a* in FIG. 6A or 8A) may further include an inductor (e.g., inductor 652*a* in FIG. 6 or 8A) coupled between the source of the gain transistor and circuit ground. In another exemplary design, a gain transistor (e.g., gain transistor 1054 in FIG. 10) may have its source coupled to circuit ground. In yet another exemplary design, the plurality of gain circuits may include at least two sets of gain circuits, with each set including two or more gain circuits. Each set of gain circuits may include a set of gain transistors (e.g., two gain transistors) sharing an inductor coupled to circuit ground (e.g., as shown in FIG. 8B).

The plurality of gain circuits may also include a plurality of high-gain circuits and a plurality of low-gain circuits, e.g., as shown in FIG. 9B. Either a low-gain circuit or a high-gain circuit may be selected for an input RF signal, e.g., depending on the received power level of the input RF signal. The high-gain circuit may include source inductive degeneration to improve linearity at high gain. The low-gain circuit may include no source inductive degeneration.

In an exemplary design, the drive circuit may comprise a plurality of cascode transistors (e.g., cascode transistors 664 in FIG. 6 or 8A). Each cascode transistor may be coupled between one of the plurality of gain circuits and one of the plurality of load circuits. In an exemplary design, for full interconnection, each gain circuit may be coupled to each of the plurality of load circuits via a respective cascode transistor. In another exemplary design, for partial interconnection, each gain circuit may be coupled to two load circuits (which may be a subset of the plurality of load circuits) via two cascode transistors. A given cascode transistor may also be shared by multiple gain circuits. For example, cascode transistor 664*a* in FIG. 8A is shared by gain circuits 650*a* and 650*c*.

In an exemplary design, each load circuit may comprise a transformer (e.g., transformer 672 in FIG. 6) having a primary coil and a secondary coil. The primary coil may be coupled between the drive circuit and a power supply. The secondary coil may provide a differential output RF signal when a drive RF signal is applied to the primary coil. In another exemplary design, each load circuit may comprise an inductor coupled between the drive circuit and a power supply. A load circuit may also comprise a transistor and/or other circuits.

The apparatus may further include a plurality of input matching circuits (e.g., input matching circuits 532 in FIG. 5) coupled to the plurality of gain circuits. Each input matching circuit may perform power and/or impedance matching for a different band or a different set of bands.

The apparatus may further include a plurality of downconverter circuits (e.g., downconverter circuits 590 in FIG. 5) coupled to the plurality of load circuits. The downconverter circuits may perform downconversion of the at least one output RF signal based on at least one LO signal. Each LO signal may be at a different frequency, which may be determined based on one or more carriers being downconverted by the associated downconverter circuit.

In an exemplary design, each input RF signal may comprise a single-ended signal, and each output RF signal may comprise a differential signal, e.g., as shown in FIG. 6. In another exemplary design, each input RF signal may comprise a single-ended signal, and each output RF signal may comprise a single-ended signal. In yet another exemplary design, each input RF signal may comprise a differential signal, and each output RF signal may comprise a differential signal.

The apparatus may operate in one of a plurality of modes. In an exemplary design, in a single-output mode, one gain circuit may be enabled to receive and amplify one input RF signal and provide one amplified RF signal. The drive circuit may receive the amplified RF signal and provide one drive RF signal. One load circuit may receive the drive RF signal and provide one output RF signal.

In an exemplary design, in an intra-band CA mode, one gain circuit may be enabled to receive and amplify one input RF signal and provide one amplified RF signal. The drive circuit may receive the amplified RF signal and providing at least two drive RF signals. At least two load circuits may receive the at least two drive RF signals and provide at least two output RF signals. In both the single-output mode and the intra-band CA mode, the one input RF signal may comprise transmissions sent on multiple carriers in a single band.

In an exemplary design, in an inter-band CA mode, at least two gain circuits may be enabled to receive and amplify at least two input RF signals and provide at least two amplified RF signals. The drive circuit may receive the at least two amplified RF signals and provide at least two drive RF signals. At least two load circuits may receive the at least two drive RF signals and provide at least two output RF signals. The at least two input RF signals may comprise transmissions sent on multiple carriers in at least two bands.

Figure 11:
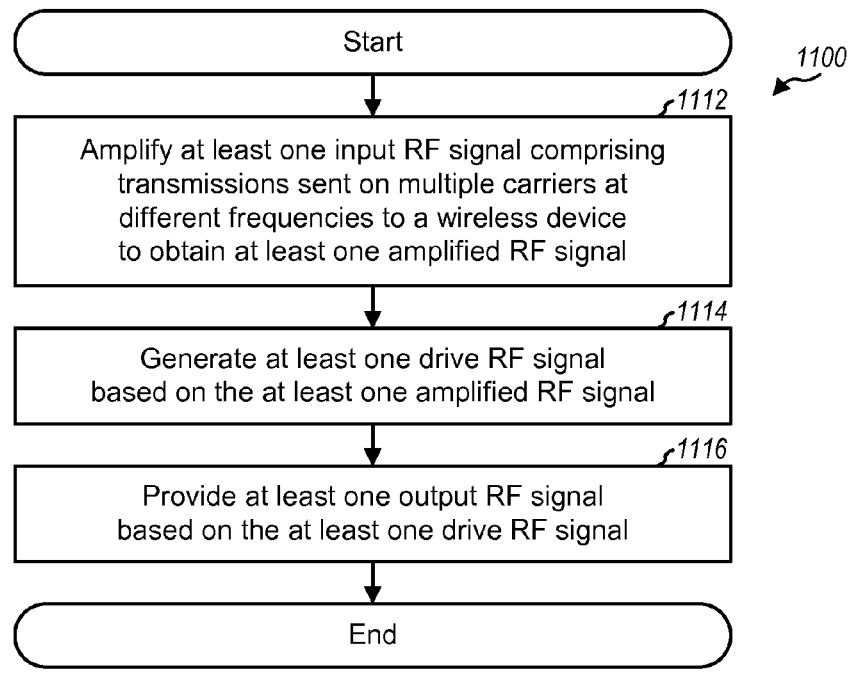
FIG. 11 shows a process for performing signal amplification.

FIG. 11 shows an exemplary design of a process 1100 for performing signal amplification in a wireless system. Process 1100 may be performed by a wireless device or by some other entity. At least one input RF signal comprising transmissions sent on multiple carriers at different frequencies to a wireless device may be amplified (e.g., with at least one of a plurality of gain circuits) to obtain at least one amplified RF signal (block 1112). At least one drive RF signal may be generated based on the at least one amplified RF signal, e.g., with a drive circuit coupled to the plurality of gain circuits (block 1114). At least one output RF signal may be provided based on the at least one drive RF signal, e.g., with at least one of a plurality of load circuits coupled to the drive circuit (block 1116). In an exemplary design, each input RF signal may comprise a single-ended signal, and each output RF signal may comprise a differential signal.

In an exemplary design, in a single-output mode, one input RF signal may be amplified (e.g., with one gain circuit) to obtain one amplified RF signal. One drive RF signal may be generated (e.g., by the drive circuit) based on the amplified RF signal. One output RF signal may be provided (e.g., by one load circuit) based on the drive RF signal.

In another exemplary design, in an intra-band CA mode, one input RF signal may be amplified (e.g., with one gain circuit) to obtain one amplified RF signal. At least two drive RF signals may be generated (e.g., by the drive circuit) based on the amplified RF signal. At least two output RF signals may be provided (e.g., by at least two load circuits) based on the at least two drive RF signals.

In yet another exemplary design, in an inter-band CA mode, at least two input RF signals may be amplified (e.g., with at least two gain circuits) to obtain at least two amplified RF signals. At least two drive RF signals may be generated (e.g., by the drive circuit) based on the at least two amplified RF signals. At least two output RF signals may be provided (e.g., by at least two load circuits) based on the at least two drive RF signals.

The MIMO LNAs described herein may be implemented on an IC, an analog IC, an RFIC, a mixed-signal IC, an ASIC, a PCB, an electronic device, etc. The MIMO LNAs may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the MIMO LNAs described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
  a plurality of gain circuits configured to receive at least one input radio frequency (RF) signal comprising transmissions sent on multiple carriers at different frequencies to a wireless device and to provide at least one amplified RF signal;
  a drive circuit coupled to the plurality of gain circuits and configured to receive the at least one amplified RF signal and provide at least one drive RF signal; and
  a plurality of load circuit coupled to the driver circuit, each of the plurality of gain circuits separately coupled from any other of the plurality of gain circuits to at least one of the plurality of load circuits.

2. The apparatus of claim 1, the plurality of load circuits further configured to receive the at least one drive RF signal and provide at least one output RF signal.

3. The apparatus of claim 1, each gain circuit of the plurality of gain circuits comprising a gain transistor configured to receive and amplify one of the at least one input RF signal and provide one of the at least one amplified RF signal when the gain circuit is enabled.

4. The apparatus of claim 3, each gain circuit further comprising an inductor coupled between a source of the gain transistor and circuit ground.

5. The apparatus of claim 1, the plurality of gain circuits including at least two sets of gain circuits, each set of gain circuits including a set of gain transistors sharing an inductor coupled to circuit ground.

6. The apparatus of claim 1, the plurality of gain circuits including:
  a first gain circuit comprising a first gain transistor having a source coupled to an inductor; and
  a second gain circuit comprising a second gain transistor having a source coupled to circuit ground.

7. The apparatus of claim 2, the drive circuit comprising a plurality of cascode transistors, each cascode transistor being coupled between one of the plurality of gain circuits and one of the plurality of load circuits.

8. The apparatus of claim 2, each load circuit of the plurality of load circuits comprising a transformer having a primary coil and a secondary coil, the primary coil being coupled between the drive circuit and a power supply, and the secondary coil providing a differential output RF signal when a drive RF signal is applied to the primary coil.

9. The apparatus of claim 1, each of the at least one input RF signal comprising a single-ended signal, and each of the at least one output RF signal comprising a differential signal.

10. The apparatus of claim 2, one of the plurality of gain circuits being enabled to receive and amplify one input RF signal and provide one amplified RF signal, the drive circuit receiving the one amplified RF signal and providing one drive RF signal, and one of the plurality of load circuits receiving the drive RF signal and providing one output RF signal.

11. The apparatus of claim 2, one of the plurality of gain circuits being enabled to receive and amplify one input RF signal and provide one amplified RF signal, the drive circuit receiving the one amplified RF signal and providing at least two drive RF signals, and at least two of the plurality of load circuits receiving the at least two drive RF signals and providing at least two output RF signals.

12. The apparatus of claim 2, at least two of the plurality of gain circuits being enabled to receive and amplify at least two input RF signals and provide at least two amplified RF signals, the drive circuit receiving the at least two amplified RF signals and providing at least two drive RF signals, and at least two of the plurality of load circuits receiving the at least two drive RF signals and providing at least two output RF signals.

13. The apparatus of claim 1, further comprising:
a plurality of input matching circuits coupled to the plurality of gain circuits.

14. The apparatus of claim 2, further comprising:
a plurality of downconverter circuits coupled to the plurality of load circuits and configured to perform downconversion of the at least one output RF signal based on at least one local oscillator (LO) signal, each LO signal being at a different frequency.

15. A method comprising:
amplifying a plurality of input radio frequency (RF) signals comprising transmissions sent on multiple carriers at different frequencies to a wireless device to obtain a plurality of amplified RF signals;
generating a plurality of drive RF signals based on the plurality of amplified RF signals; and
providing, using a plurality of load circuits, a plurality of output RF signals based on the plurality of drive RF signals, each of the output RF signals separately provided from each of the amplified RF signals.

16. The method of claim 15, the amplifying at least one input RF signal comprising amplifying one input RF signal to obtain one amplified RF signal, the generating at least one drive RF signal comprising generating at least two drive RF signals based on the one amplified RF signal, and the providing at least one output RF signal comprising providing at least two output RF signals based on the at least two drive RF signals.

17. The method of claim 15, the amplifying at least one input RF signal comprising amplifying at least two input RF signals to obtain at least two amplified RF signals, the generating at least one drive RF signal comprising generating at least two drive RF signals based on the at least two amplified RF signals, and the providing at least one output RF signal comprising providing at least two output RF signals based on the at least two drive RF signals.

18. An apparatus comprising:
means for amplifying a plurality of input radio frequency (RF) signals comprising transmissions sent on multiple carriers at different frequencies to a wireless device to obtain a plurality of amplified RF signals;
means for generating a plurality of drive RF signals based on the plurality of amplified RF signals; and
means for providing, using a plurality of load circuits, a plurality of output RF signals based on the plurality of drive RF signals, each of the output RF signals separately provided from each of the amplified RF signals.

19. The apparatus of claim 18, the means for amplifying at least one input RF signal comprising means for amplifying one input RF signal to obtain one amplified RF signal, the means for generating at least one drive RF signal comprising means for generating at least two drive RF signals based on the one amplified RF signal, and the means for providing at least one output RF signal comprising means for providing at least two output RF signals based on the at least two drive RF signals.

20. The apparatus of claim 18, the means for amplifying at least one input RF signal comprising means for amplifying at least two input RF signals to obtain at least two amplified RF signals, the means for generating at least one drive RF signal comprising means for generating at least two drive RF signals based on the at least two amplified RF signals, and the means for providing at least one output RF signal comprising means for providing at least two output RF signals based on the at least two drive RF signals.

* * * * *